(12) United States Patent  (10) Patent No.: US 7,505,540 B2
Fernald  (45) Date of Patent: Mar. 17, 2009

(54) CLOCK RECOVERY METHOD FOR BURSTY COMMUNICATIONS

(75) Inventor: Kenneth W. Fernald, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 412 days.

(21) Appl. No.: 11/179,249

(22) Filed: Jul. 12, 2005

(65) Prior Publication Data

US 2005/0243958 A1 Nov. 3, 2005

Related U.S. Application Data

(63) Continuation of application No. 10/244,728, filed on Sep. 16, 2002, now Pat. No. 6,917,658.

(51) Int. Cl.
H04L 7/00 (2006.01)
H04B 1/38 (2006.01)

(52) U.S. Cl. .................. 375/355; 375/222; 375/371

(58) Field of Classification Search ............. 375/219, 375/222, 354, 355, 371, 373, 376
See application file for complete search history.

(56) References Cited

U.S. PATENT DOCUMENTS

| | | | |
|---|---|---|---|
| 3,961,138 A | 6/1976 | Fellinger | |
| 4,339,817 A | 7/1982 | Hata et al. | |
| 4,352,053 A | 9/1982 | Oguchi et al. | |
| 4,479,097 A | 10/1984 | Larson et al. | |
| 4,851,792 A | 7/1989 | Ochiai et al. | |
| 5,084,685 A * | 1/1992 | Moller et al. | 331/1 A |
| 5,448,103 A | 9/1995 | De Wit | |
| 5,546,433 A | 8/1996 | Tran et al. | |
| 5,572,558 A | 11/1996 | Beherns | |
| 5,596,765 A | 1/1997 | Baum et al. | |
| 5,604,467 A | 2/1997 | Matthews | |
| 5,757,857 A | 5/1998 | Buchwald | |
| 5,761,255 A | 6/1998 | Shi | |
| 5,889,441 A | 3/1999 | Inn | |
| 6,297,705 B1 | 10/2001 | Williams et al. | |
| 6,337,605 B1 | 1/2002 | Divoux | |
| 6,407,641 B1 | 6/2002 | Williams et al. | |
| 6,480,038 B1 | 11/2002 | Horn | |
| 6,793,144 B2 * | 9/2004 | Guez et al. | 235/492 |
| 6,816,976 B2 * | 11/2004 | Wright et al. | 713/323 |
| 6,839,570 B2 | 1/2005 | Hutchison et al. | |
| 6,954,506 B2 * | 10/2005 | Cho | 375/321 |
| 7,210,054 B2 * | 4/2007 | Jahagirdar et al. | 713/502 |
| 2001/0034246 A1 | 10/2001 | Hutchison et al. | |
| 2002/0180493 A1 | 12/2002 | Horn | |

* cited by examiner

OTHER PUBLICATIONS

O. Berrig, An Improved PLL For Tune Measurements, Proceedings DIPAC 2003—Mainz Germany, pp. 101-103, CERN AT/MTM, Geneva, Switzerland.

*Primary Examiner*—David B Lugo
(74) *Attorney, Agent, or Firm*—Howison & Arnott, L.L.P.

(57) ABSTRACT

Clock recovery method for bursty communications. A method is disclosed for recovering the clock from a received data stream that comprising bursts of data with zones of substantially no data between the bursts of data. A receive clock is provided that operates within a reference frequency range. The time between data transitions in the received data is then measuring relative to the receive clock. A determination is then made if the measured time is substantially an integral of the receive clock. If not a substantial integral of the receive clock, the frequency of the receive clock is adjusted to compensate for the difference.

22 Claims, 13 Drawing Sheets

FIG. 18
| SP | 0 | 1 | 2 | 3 | 4 | 5 | 6 | 7 | 8 | 9 | 10 | 11 | 12 | 13 | 14 | ... |
|----|---|---|---|---|---|---|---|---|---|---|----|----|----|----|----|-----|
| PH | 0 | 1 | 2 | 3 | 0 | 1 | 2 | 3 | 0 | 1 | 2  | 3  | 0  | 1  | 2  |     |
FIG. 19
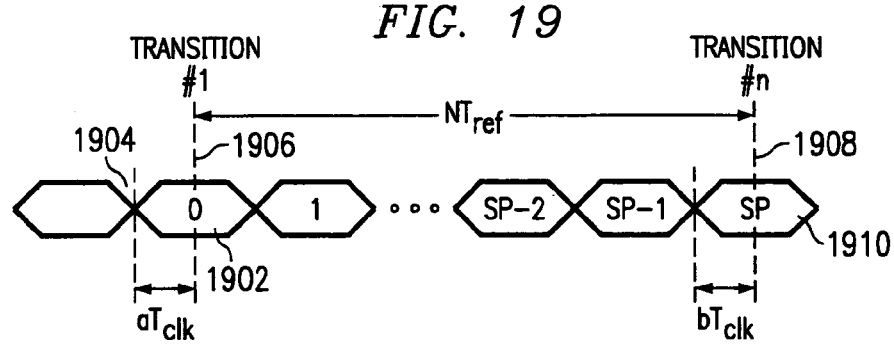
FIG. 20
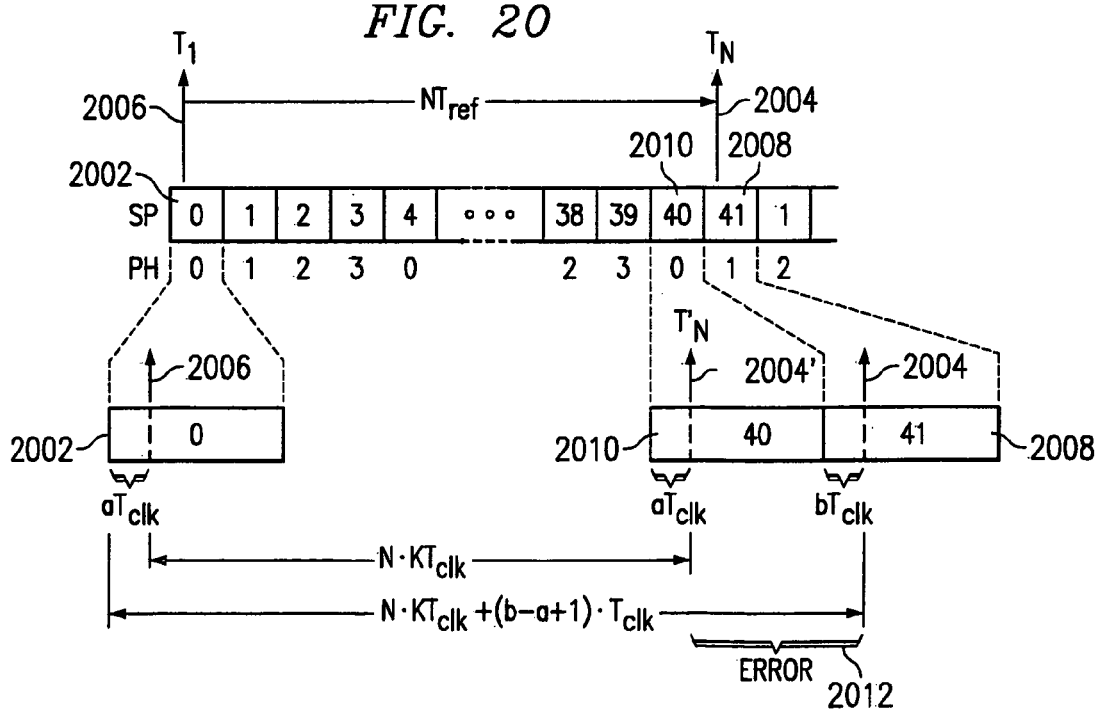

FIG. 25

| R/W | R/W | R/W | R/W | R/W | R/W | R/W | R/W | RESET VALUE |
|---|---|---|---|---|---|---|---|---|
| -   |     |     |     |     |     |     |     | VARIABLE SFR |
| BIT7 | BIT6 | BIT5 | BIT4 | BIT3 | BIT2 | BIT1 | BIT0 | ADDRESS: 0xB3 |

Bit7: UNUSED. Read=0. Write=don't care.
Bits 6-0: OSCICL: Internal Oscillator Calibration Register.
This register determines the internal oscillator period

FIG. 26

| R/W | R/W | R/W | R | R/W | R/W | R/W | R/W | RESET VALUE |
|---|---|---|---|---|---|---|---|---|
| - | - | - | IFRDY | CLKSL | IOSCEN | IFCN1 | IFCN0 | 00010100 SFR |
| BIT7 | BIT6 | BIT5 | BIT4 | BIT3 | BIT2 | BIT1 | BIT0 | ADDRESS: 0xB2 |

Bits7-5: UNUSED. Read=000b, Write=don't care.
Bit4: IFRDY: Internal Oscillator Frequency Ready Flag.
    0: Internal Oscillator is not running at programmed frequency.
    1: Internal Oscillator is running at programmed frequency.
Bit3: CLKSL: System Clock Source Select Bit.
    0: SYSCLK derived from the Internal Oscillator, and scaled as per the IFCN bits.
    1: SYSCLK derived from the External Oscillator circuit.
Bit2: IOSCEN: Internal Oscillator Enable Bit.
    0: Internal Oscillator Disabled.
    1: Internal Oscillator Enabled.
Bits1-0: IFCN1-0: Internal Oscillator Frequency Control Bits.
    00: SYSCLK derived from Internal Oscillator divided by 8.
    01: SYSCLK derived from Internal Oscillator divided by 4.
    10: SYSCLK derived from Internal Oscillator divided by 2.
    11: SYSCLK derived from Internal Oscillator divided by 1.

CLOCK RECOVERY METHOD FOR BURSTY COMMUNICATIONS

CROSS-REFERENCE TO RELATED APPLICATIONS

This is a Continuation Application of U.S. Ser. No. 10/244,728, filed Sep. 16, 2002 now U.S. Pat. No. 6,917,658, issued on Jul. 12, 2005, entitled "CLOCK RECOVERY METHOD FOR BURSTY COMMUNICATIONS" and it is related to U.S. patent application Ser. No. 09/885,459, filed Jun. 19, 2001 and entitled "FIELD PROGRAMMABLE MIXED-SIGNAL INTEGRATED CIRCUIT", which is incorporated herein by reference and is co-pending of even date hereof with U.S. patent application Ser. No. 09/885,459, entitled "PRECISION OSCILLATOR FOR AN ASYNCHRONOUS TRANSMISSION SYSTEM," and Ser. No. 10/244,344, which is also incorporated herein by reference.

TECHNICAL FIELD OF THE INVENTION

This invention pertains in general to clock recovery methods and, more particularly, a method for recovering the clock in a communications system having Bursty signal transitions, e.g., USB.

BACKGROUND OF THE INVENTION

Serial bus communication protocols have long been utilized for communications between two devices. This serial communication can provide long range or short range communication between the two devices and can either be "synchronous" or "asynchronous." For asynchronous transmission, there are provided two independent clocks, one at the master and one at the slave node (note that either device on either end of the communication path can be either the master or the slave) that are each operable to receive or transmit data based solely upon their clock. Asynchronous communication tends to be somewhat slower than synchronous communication since there will naturally be a finite error between the two clocks. For synchronous communication, either a separate clock signal is provided between the two devices on a separate clock line, or some type of clock recovery is utilized. One type of synchronous serial transmission protocol that utilizes a separate clock line is referred to as I²C. In a clock recovery system, the clock signal is overlapped with the data on the same line, such that the clock information can be recovered from data transitions. One type of such clock recovery protocol is Manchester coded PSK. Another type, that associated with the present disclosure, is Universal Serial Bus (USB).

In order to maintain sync between the two systems, the receiver will typically "lock" onto the received data and extract the clock information therefrom. There will typically be provided a receive clock, which will have the frequency and phase thereof varied to substantially equal the frequency and phase of a transmit clock which is extracted from the receive data. One technique for providing this receive clock and adjusting the frequency and phase thereof is a phase locked loop. For continuous transmission systems, such as Manchester coded PSK, data transmissions are present on a substantially continual base, such that the phase and frequency error between the receive clock and the transmit clock and be continually minimized or corrected for. However, with respect to the USB transmission system, these have what is referred to as "bursty" communications; that is, data is only present in bursts. Therefore, substantially continual data transitions are not present in order for a phase locked loop to lock onto. As such, during times of no transmission, the receive clock may drift in phase and frequency and, upon receipt of the next burst of data, lock will again have to be acquired before the integrity of the data reception can be guaranteed.

SUMMARY OF THE INVENTION

The present invention disclosed and claimed herein, in one aspect thereof, comprises a method for recovering the clock from a received data stream comprising bursts of data with zones of substantially no data between the bursts of data. A receive clock is provided that operates within a reference frequency range. The time between data transitions in the received data is then measuring relative to the receive clock. A determination is then made if the measured time is substantially an integral of the receive clock. If not a substantial integral of the receive clock, the frequency of the receive clock is adjusted to compensate for the difference.

BRIEF DESCRIPTION OF THE DRAWINGS

For a more complete understanding of the present invention and the advantages thereof, reference is now made to the following description taken in conjunction with the accompanying Drawings in which:

FIG. 18 illustrates a diagrammatic view of the SP counter operation relative to the PH modulo-K count;

FIG. 19 illustrates a diagram of the SP count value;

FIG. 20 illustrates a diagrammatic view of the receive data transitions relative to the SP count;

FIGS. 25 and 26 illustrate tables for the oscillator controls.

DETAILED DESCRIPTION OF THE INVENTION

Figure 1:
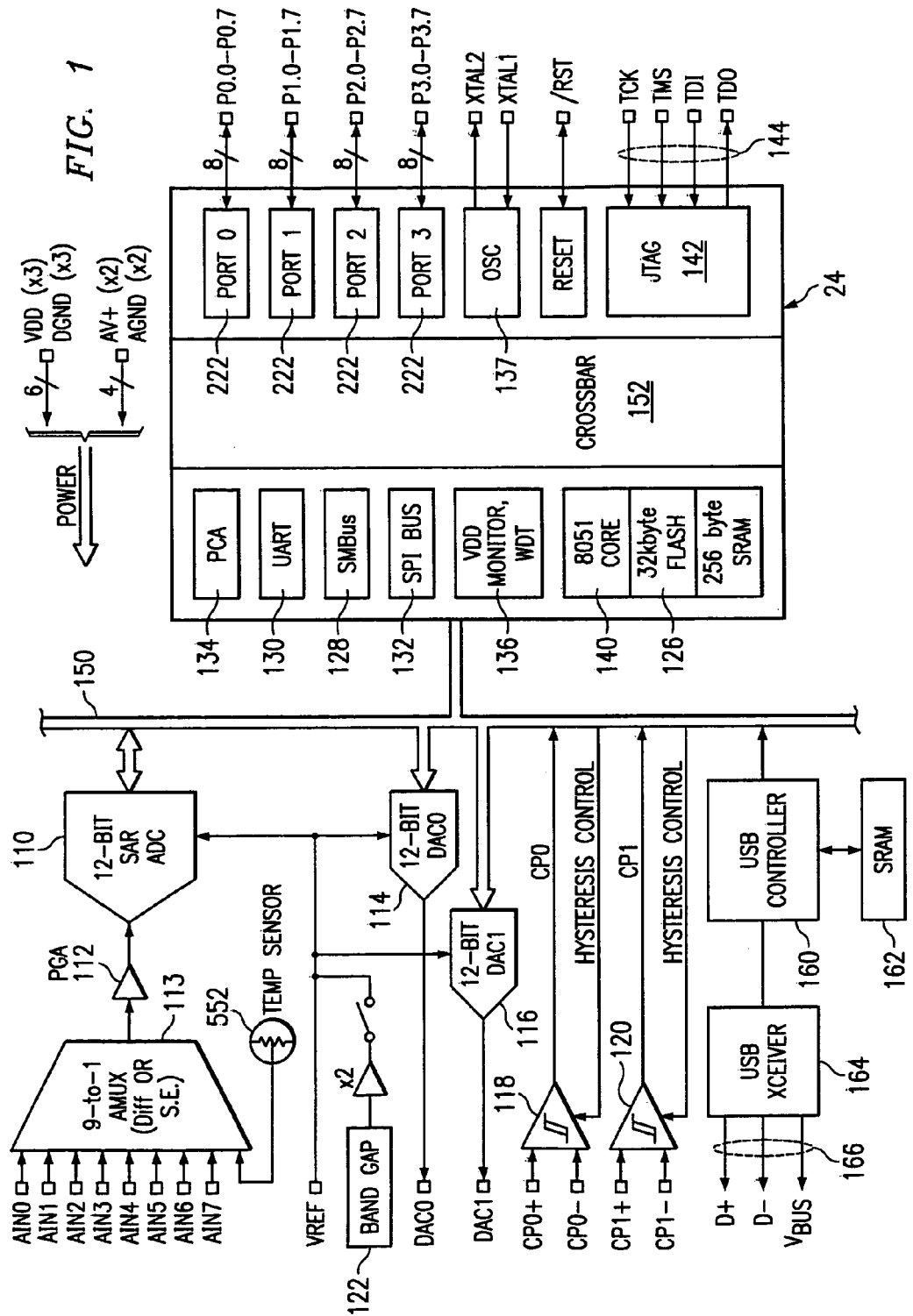
FIG. 1 illustrates an overall block diagram of a mixed-signal integrated circuit utilizing a USB port.

Referring now to FIG. 1, there is illustrated an integrated circuit that is comprised of a fully integrated mixed-signal System on a Chip with a true 12-bit multi-channel ADC 110 with a programmable gain pre-amplifier s12, two 12-bit DACs 114 and 116, two voltage comparators 118 and 120, a voltage reference 22, and an 8051-compatible microcontroller core 124 with 32 kbytes of FLASH memory 126. There is also provided an I2C/SMBUS 128, a UART 130, and an SPI 132 serial interface 140 implemented in hardware (not "bit-banged" in user software) as well as a Programmable Counter/Timer Array (PCA) 134 with five capture/compare modules. There are also 32 general purpose digital Port I/Os. The analog side further includes a multiplexer 113 as operable to interface eight analog inputs to the programmable amplifier 112 and to the ADC 110.

With an on-board $V_{DD}$ monitor 136, WDT, and clock oscillator 137, the integrated circuit is a stand-alone System on a Chip. The MCU effectively configures and manages the analog and digital peripherals. The FLASH memory 126 can be reprogrammed even in-circuit, providing non-volatile data storage, and also allowing field upgrades of the 8051 firmware. The MCU can also individually shut down any or all of the peripherals to conserve power.

A JTAG interface 142 allows the user to interface with the integrated circuit through a conventional set of JTAG inputs 144. On-board JTAG debug support allows non-intrusive (uses no on-chip resources), full speed, in-circuit debug using the production integrated circuit installed in the final application. This debug system supports inspection and modification of memory and registers, setting breakpoints, watchpoints, single stepping, run and halt commands. All analog and digital peripherals are fully functional when debugging using JTAG.

The microcontroller 140 is fully compatible with the MCS-51™ instruction set. Standard 803x/805x assemblers and compilers can be used to develop software. The core has all the peripherals included with a standard 8052, including three 16-bit counter/timers, a full-duplex UART, 256 bytes of internal RAM, 128 byte Special Function Register (SFR) address space, and four byte-wide I/O Ports. A Universal Serial Bus (USB) interface is provided with a controller 160 that interfaces with memory 162 (of which all or a portion may be on the integrated circuit with the controller 160) and a USB transceiver 164. The transceiver 164 will interface with dedicated pins 166 to receive/transmit serial data. This data is referred to as "bursty communications."

Referring further to FIG. 1, the core 141 is interfaced through an internal BUS 150 to the various input/output blocks. A cross-bar switch 152 provides an interface between the UART 130, SPI BUS 132, etc., and the digital I/O output. This is a configurable interface.

The core 140 employs a pipelined architecture that greatly increases its instruction throughput over the standard 8051 architecture. In a standard 8051, all instructions except for MUL and DIV take 12 or 24 system clock cycles to execute with a maximum system clock of 12 MHz. By contrast, the core 140 executes seventy percent (70%) of its instructions in one or two system clock cycles, with only four instructions taking more than four system clock cycles. The core 140 has a total of 109 instructions. The number of instructions versus the system clock cycles to execute them is as follows:

| | Instructions | | | | | | | | |
|---|---|---|---|---|---|---|---|---|---|
| | 26 | 50 | 5 | 14 | 7 | 3 | 1 | 2 | 1 |
| Clocks to Execute | 1 | 2 | 2/3 | 3 | 3/4 | 4 | 4/5 | 5 | 8 |

With the core 140's maximum system clock at 20 MHz, it has a peak throughput of 20 MIPS.

As an overview to the system of FIG. 1, the cross-bar switch 152 can be configured to interface any of the ports of the I/O side thereof to any of the functional blocks 128, 130, 132, 134 or 136 which provide interface between the cross-bar switch 152 and the core 140. Further, the cross-bar switch can also interface through these functional blocks 128-136 directly to the BUS 150.

Figure 2:
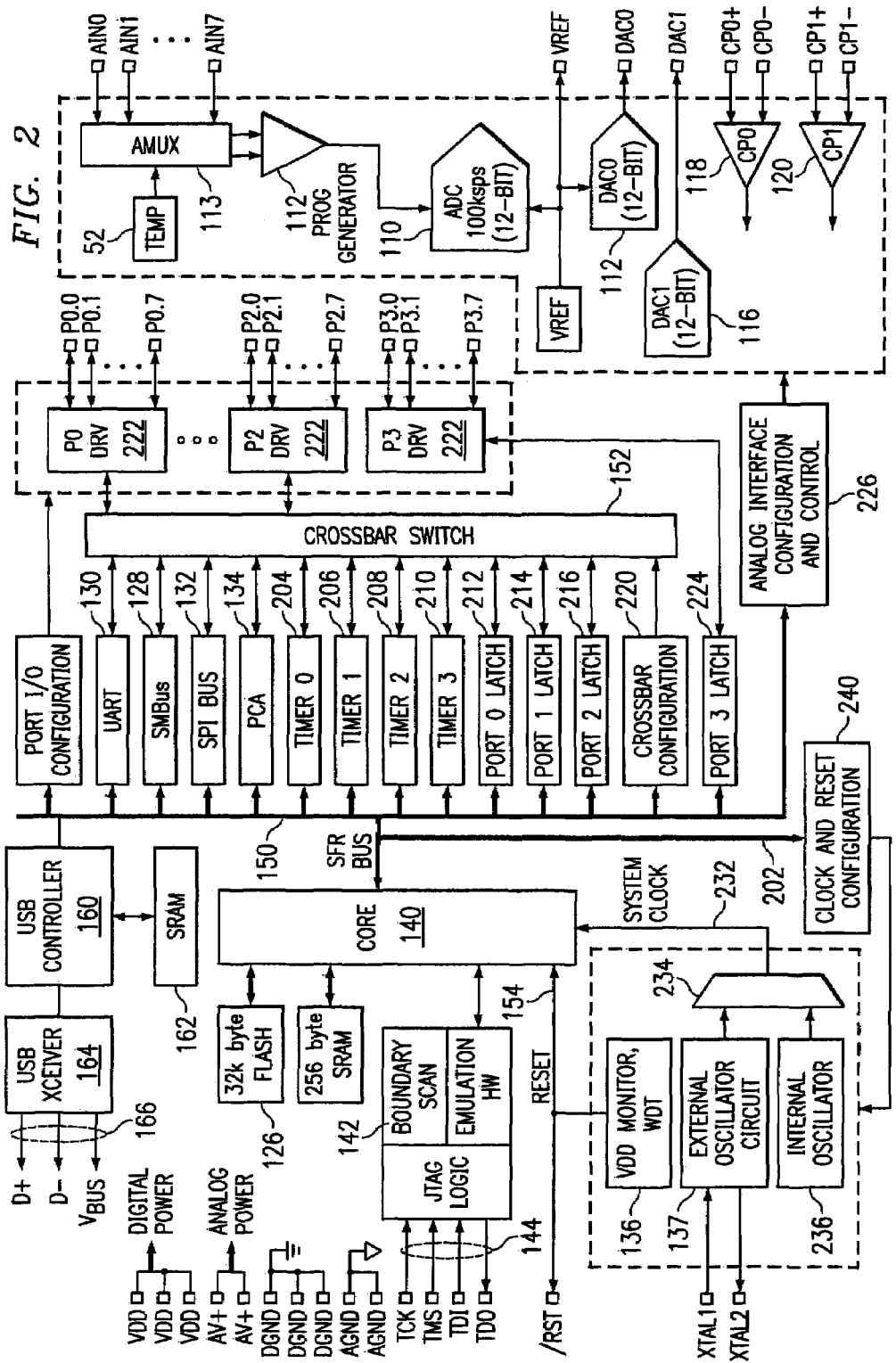
FIG. 2 illustrates a more detailed diagram of the integrated circuit of FIG. 1.

Referring now to FIG. 2, there is illustrated a more detailed block diagram of the integrated circuit FIG. 1. In this embodiment, it can be seen that the cross-bar switch 152 actually interfaces to a system BUS 202 through the BUS 150. The BUS 150 is a BUS as operable to allow core 140 to interface with the various functional blocks 128-134 in addition to a plurality of timers 204, 206, 208 and 210, in addition to three latches 212, 214 and 216. The cross-bar switch 152 is configured with a configuration block 220 that is configured by the core 140. The other side of the cross-bar switch 152, the I/O side, is interfaced with various port drivers 222, which is controlled by a port latch 224 that interfaces with the BUS 150. In addition, the core 140 is operable to configure the analog side with an analog interface configuration in control block 226.

The core 140 is controlled by a clock on a line 232. The clock is selected from, as illustrated, one of two locations with a multiplexer 234. The first is external oscillator circuit 137 and the second is an internal oscillator 236. The internal oscillator circuit 236 is a precision temperature compensated oscillator, as will be described hereinbelow. The core 140 is also controlled by a reset input on a reset line 154. The reset signal is also generated by the watchdog timer (WDT) circuit 136, the clock and reset circuitry all controlled by clock and reset configuration block 240, which is controlled by the core 140. Therefore, it can be seen that the user can configure the system to operate with an external crystal oscillator or an internal precision non-crystal non-stabilized oscillator that is basically "free-running." This oscillator 236, as will be described hereinbelow, generates the timing for both the core 140 and for the UART 130 timing and is stable over temperature.

Figure 3:
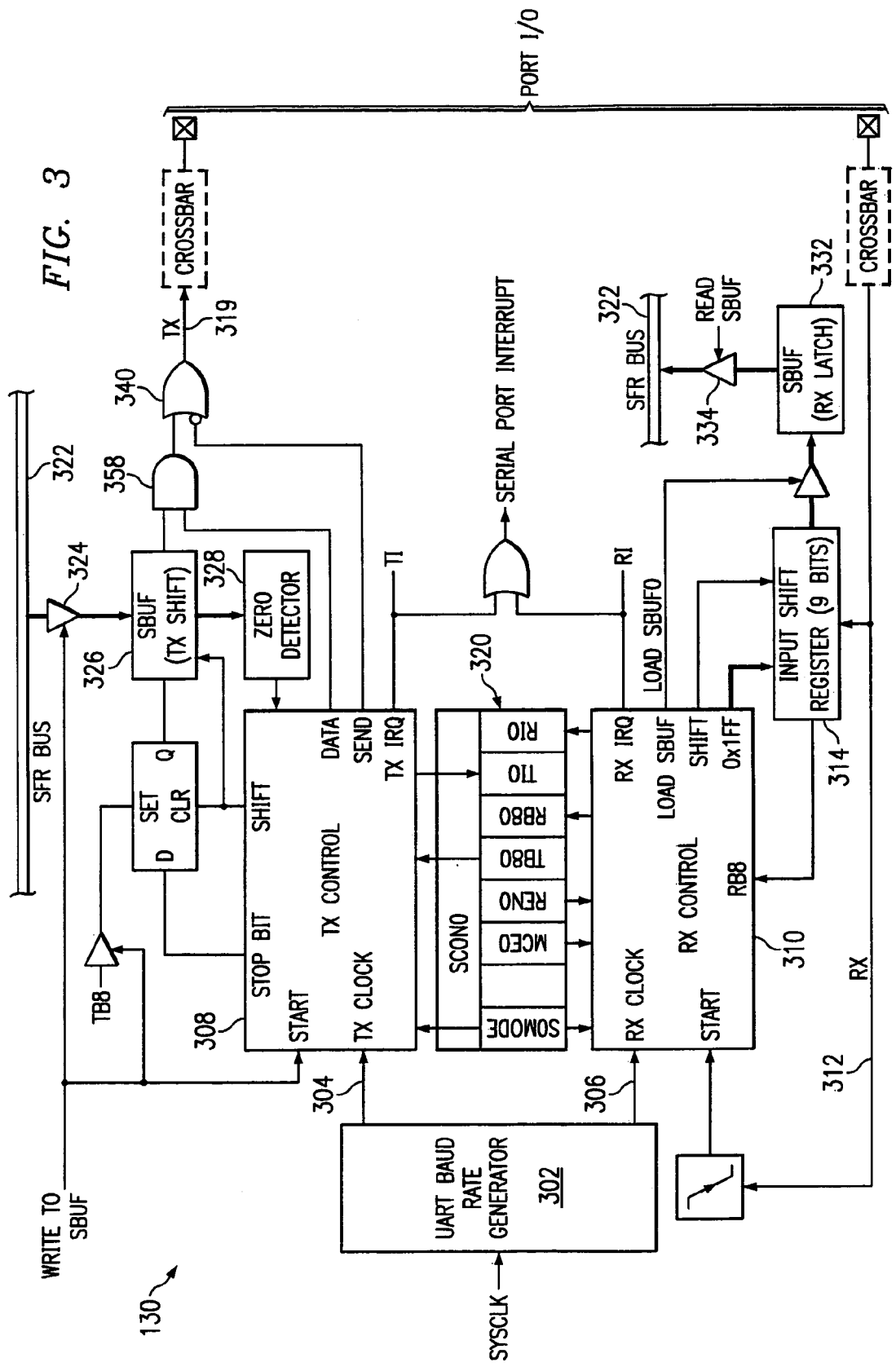
FIG. 3 illustrates a block diagram of the UART.

Referring now to FIG. 3, there is illustrated a block diagram of the UART 130. A system clock is input to a baud rated generator 302 which provides a transmit clock on the line 304 and a receive clock on a line 306. The transmit clock is input to a transmit control block 308 and the receive clock is input to a receive control block 310. A serial control register (SCON0) 320 is provided that is operable to provide control signals to the control blocks 308 and 310. The transmit data is received from a bus 322 and is input through a gate 324 to a serial data buffer (SBUF) 326. The output of this data is input to a zero detector 328 and then to a control block 308. The system is an asynchronous, full duplex serial port device and two associated special function registers, a serial control register (SCON0) 320 and a serial data buffer (SBUF0) (not shown), are provided. Data is received on a line 312 and is input to an input shift register 314. This is controlled by the control block 310 to output the shifted-in data to a latch 332 and then through a gate 334 to an SFR bus 322. In transmit mode, data is received from an SFR bus 321 and input through a gate 324 to a transmit shift register 326 which is output to a transmit line 319 from the register 326 or from the control block 308 through an AND gate 338 which is input to one input of an OR gate 340 to the transmit line 319. This is all controlled by the control block 308.

Figure 3A:
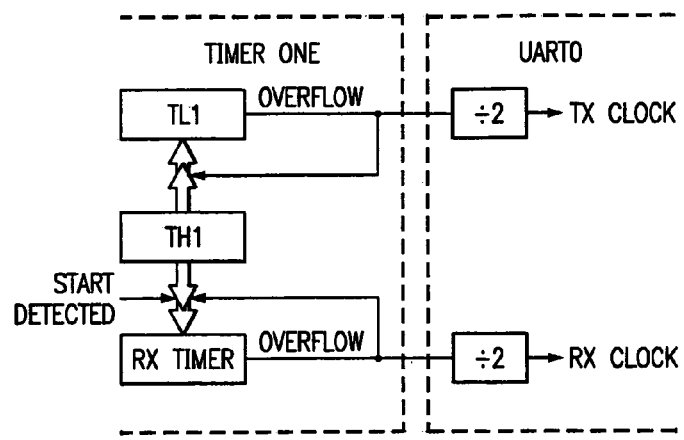
FIG. 3A illustrates a block diagram of the baud rate generator.

Referring now to FIG. 3A, there is illustrated a block diagram of the baud rate generator 302. This baud rate is generated by a timer wherein a transmit clock is generated by a block TL1 and the receive clock is generated by a copy of the TL1 illustrated as an RX Timer, which copy of TL1 is not user-accessible. Both the transmit and receive timer overflows are divided by two for the transmit clock and the receive clock baud rates. The receive timer runs when timer 1 is enabled, and uses the same TH1 value, this being a reload value. However, an RX Timer reload is forced when Start Condition is detected on the receive pin. This allows a receipt to begin any time a Start is detected, independent of the state of the transmit timer.

Figure 4:
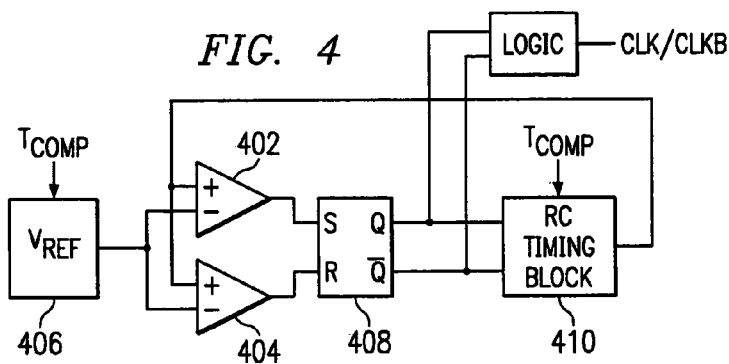
FIG. 4 illustrates a block diagram of the precision oscillator.

Referring now to FIG. 4, there is illustrated a diagrammatic view of the precision internal oscillator 236 that is disposed on integrated circuit. The integrated circuit, as noted hereinabove, is a commercially available integrated circuit that incorporates the precision oscillator 236 in association therewith. The integrated circuit provides the capability of selecting a crystal oscillator wherein a crystal is disposed between two crystal ports, selecting an external clock signal or selecting an internal free-running oscillator. The free-running oscillator is illustrated in FIG. 4 as the precision oscillator 236. At the center of the oscillator are two comparators, a first comparator 402 and a second comparator 404. A temperature compensated voltage reference circuit 406 is provided that provides a temperature compensated voltage reference (the trip voltage $V_{TRIP}$) to the negative inputs of the comparators 402. The outputs of the comparators 402 and 404 are connected to the Set and Reset, respectively, inputs of an S/R latch 408. The Q and Q-Bar outputs thereof are input to an output RC timing circuit 410 that is operable to define the period of the oscillator, the output of the S/R latch 408 providing the output clock signal. The output of this RC timing circuit 410 is fed back to the positive inputs of the comparators 402 and 404. The output RC timing circuit 410 is also temperature compensated. As will be described hereinbelow, the voltage reference block 406 provides a negative temperature coefficient, whereas the comparators 402 and S/R latch 408 combination provide a positive temperature coefficient and the output RC timing circuit 410 provide a positive temperature coefficient. The overall combined coefficient will be approximately zero, as will be described hereinbelow.

Figure 5:
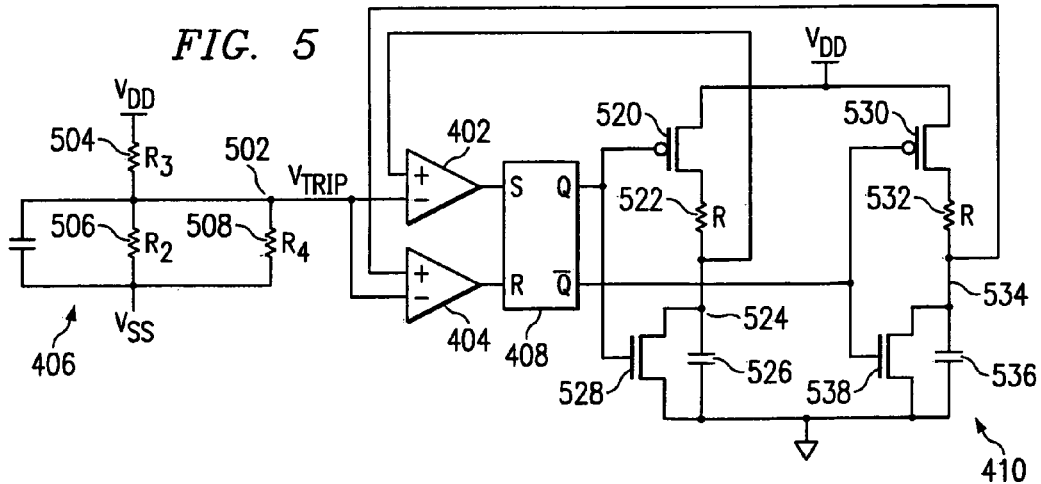
FIG. 5 illustrates a more detailed diagram of the precision oscillator of FIG. 4.

Referring now to FIG. 5, there is illustrated a more detailed diagrammatic view of the precision oscillator of FIG. 4. The voltage reference circuit 406 is comprised of a voltage divider that divides the supply voltage $V_{DD}$ to a voltage $V_{TRIP}$ on a node 502. The voltage divider is comprised of a top resistor 504 labeled $R_3$. The bottom half of the voltage divider is comprised of two parallel resistors, a resistor 506 labeled $R_2$ and a resistor 508 labeled $R_4$. For nomenclature purposes, the resistors will be referred as $R_2$, $R_3$ and $R_4$.

Resistors $R_3$ and $R_4$ are fabricated from the same material to provide a positive temperature coefficient. These are fabricated from the N-diffusion material, which has a positive temperature coefficient. By comparison, $R_2$ is manufactured from polycrystalline silicon in the first layer which is referred to as Poly1 material, and which also has a positive temperature coefficient, but which differs. It should be understood that different materials could be utilized, it only being necessary that there be two resistors having different temperature coefficients. Although not a part of this disclosure, Poly1 material is basically the first layer of polycrystalline silicon that is disposed on the substrate over a protective oxide layer, from which such structures as the gates of transistors are fabricated. With the positive temperature coefficients of the resistors, this will result in the voltage $V_{TRIP}$ having a negative coefficient. As will be described hereinbelow, the resistors being of different materials facilitates adjustments between the two resistors $R_2$ and $R_4$ to vary the temperature coefficient. This is primarily due to the fact that they are of differing materials.

Figure 6:
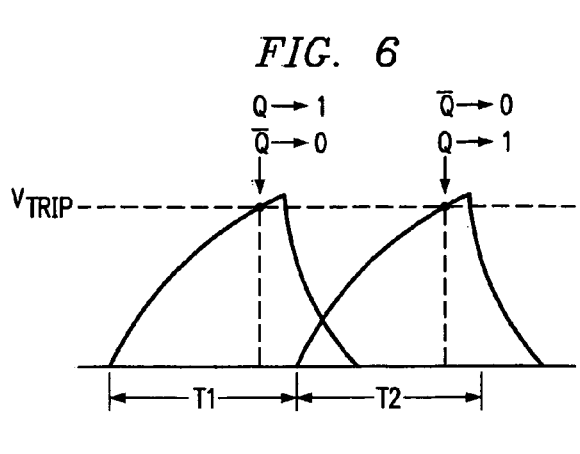
FIG. 6 illustrates an output waveform diagram of a precision oscillator.

The output RC timing circuit 410 is comprised of two RC circuits. The first RC circuit is comprised of a P-channel transistor 520 having the source/drain path thereof connected between $V_{DD}$ and one side of a resistor 522 labeled R, the other end thereof connected to a node 524. Node 524 is connected to one side of a capacitor 526, the other side of the capacitor 526 connected to $V_{SS}$.-channel transistor 528 has the source/drain path thereof connected across capacitor 526, and the gate thereof connected to the gate of P-channel transistor 520 and also to the Q-output of the S/R latch 408. Node 524 comprises the positive input of the comparator 402. The second RC network is comprised of a P-channel transistor 530 having the source/drain path thereof connected between $V_{DD}$ and one side of a resistor 532 (labeled R), the other side of resistor 532 connected to a node 534. Node 534 is connected to one side of a capacitor 536, the other side thereof connected to $V_{SS}$. An N-channel transistor 538 has the source/drain path thereof connected between node 534 and $V_{SS}$. The gate of transistor 538 is connected to the gate of transistor 530 and also to the Q-Bar output of S/R latch 408. The node 534 comprises the positive input of the comparator 404. The output waveform for the circuit of FIG. 5 is illustrated in FIG. 6, wherein conventional RC rise and fall curves are illustrated for each of the RC circuits. The period of each output waveform is defined from the initial turn-on point where voltage is applied to the resistor R to the point where resistor R of the other of the RC circuits is turned on. There will be period T1 and a period T2 for each of the RC circuits, respectively. The sum of the two periods is equal to the period for the oscillator. Transistors 520, 530, 528 and 538 are sized such that their resistances are substantially less than the value of resistors 522 and 532. The resistors 522 and 532 are fabricated from Poly1 material due to its low temperature coefficient. The period of the oscillator is the sum of the period T1 and the period T2 plus two times the delay of the comparators.

Figure 7:
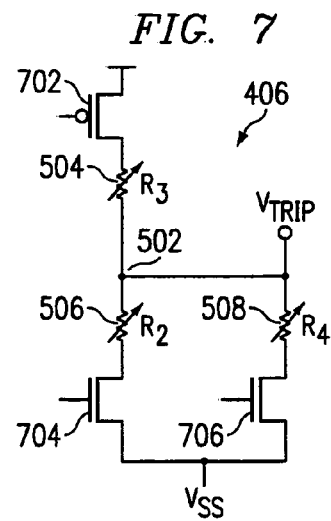
FIG. 7 illustrates a schematic diagram of the temperature compensated reference voltage.

Referring now to FIG. 7, there is illustrated more detailed block diagram of the implementation of the voltage reference 406. The resistor 504 which is illustrated in FIG. 5 as being connected to $V_{DD}$ is actually connected through the source/drain of the P-channel resistor 702 to $V_{DD}$ with the gate thereof connected to a bias voltage. Similarly, the bottom end of resistor 506 is connected to $V_{SS}$ through the source/drain path of a N-channel transistor 706 to $V_{SS}$, the gates of both transistors 704 and 706 connected to a bias. Transistors 702, 704 and 706 are sized such that their resistances are substantially less than the value of resistors $R_2$, $R_3$ and $R_4$. Also, first order power supply independence comes from the fact that the trip voltage $V_{Trip}$ is proportional to the supply voltage, i.e., $V_{DD}*(1-e(t/\tau))$. Therefore, in the time it takes to reach the trip voltage at the input of the comparator is supply independent to the first order. This is one reason that the RC timing circuits are utilized rather than a current source charging a capacitor, which does not provide the first order cancellation.

$$V_{Trip} = V_{DD} * \text{ratio}$$

$$V_{Trip} = V_{DD} * (1 - e(-T1/\tau))$$

$$T1 = -\tau * 1n(1 - V_{Trip}/V_{DD})$$

Thus: $T1 = -\tau * 1n(1 - \text{ratio})$

From a temperature compensation standpoint, there are a number of aspects of the voltage reference circuit 406 that can be utilized to provide temperature compensation. Commonly, the resistors have a set variation with respect to temperature. The Poly1 resistor $R_2$ has a temperature coefficient of 255 ppm whereas the N-diffused resistors $R_3$ and $R_4$ have a temperature coefficient of 800 ppm. In the present disclosure, it is desirable to have a negative coefficient of 462 ppm.

To analyze how a negative temperature coefficient is created with the resistors $R_2$, $R_3$ and $R_4$, consider that $R_2$ and $R_4$ are a parallel combination defined as REQ=$R_2//R_4$. If REQ and $R_3$ have different temperature coefficients with TCR$_3$>TCREQ, then the trip voltage will have a negative temperature coefficient. $V_{TRIP}$ will be defined as follows:

$$V_{TRIP} = \frac{REQ}{R_3 + REQ} V_{DD}$$

$$\frac{1}{V_{TRIP}} \frac{dV_{TRIP}}{dT} = \frac{1}{REQ} \frac{dREQ}{dT} - \frac{R_3}{R_3 + REQ} \left[ \frac{1}{REQ} \frac{dREQ}{dT} \right] - \frac{R_3}{R_3 + REQ} \left[ \frac{1}{R_3} \frac{dR_3}{dT} \right]$$

$$\frac{1}{V_{TRIP}} \frac{dV_{TRIP}}{dT} = \frac{R_2}{R_3 + REQ} [TCREQ - TCR_3]$$

For REQ, is must be assumed that $V_{TRIP}$ is a fixed value, such that $R_2$ and $R_4$ can be varied to target a specific temperature coefficient. This can be shown by the following equations:

$$\frac{1}{REQ} \frac{dREQ}{dT} = \left[ \frac{1}{R_2} \frac{dR_2}{dT} \right] + \left[ \frac{1}{R_4} \frac{dR_4}{dT} \right] - \frac{R_2}{R_2 + R_4} \left[ \frac{1}{R_2} \frac{dR_2}{dT} \right] - \frac{R_4}{R_2 + R_4} \left[ \frac{1}{R_4} \frac{dR_4}{dT} \right]$$

$$TCREQ = TCR_2 + TCR_4 - \frac{R_2}{R_2 + R_4} TCR_2 - \frac{R_4}{R_2 + R_4} TCR_4$$

The results of equation 5 can be utilized in equation 3 to set the final temperature coefficient of $V_{TRIP}$.

Figure 8:
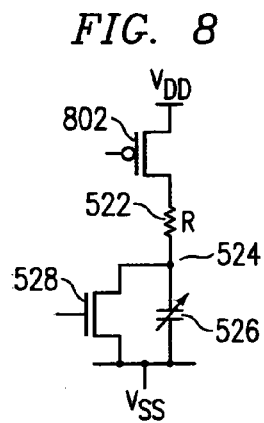
FIG. 8 illustrates a schematic diagram of one-half of the output wave shaping circuit.

Referring now to FIG. 8, there is illustrated a detailed diagram of the implementation of one-half of the charging structure 410. This, as with the case with respect to the voltage reference structure 406, there is provided a P-channel transistor 802 for connecting the top end of the resistor 522 to $V_{DD}$, with the gate thereof connected to a bias supply. This P-channel transistor introduces very little error in the temperature operation thereof. Capacitor 526 is a variable capacitor, such that the value thereof can be varied to set the period for the oscillator. The capacitor 526 is fabricated from an insulator disposed between the first layer poly, P1, and the second layer poly, P2, with a layer of oxide disposed therebetween. The resistor 522 is an N-diffusion resistor.

The resistors $R_3$, $R_2$ and $R_4$ in the voltage reference circuit 406 are variable resistors that can be mask programmable resistors. Resistor $R_3$ is utilized to set the value of $V_{TRIP}$ and resistors $R_2$ and $R_4$ are utilized to select a temperature coefficient, since they have dissimilar temperature coefficients.

Figure 9:
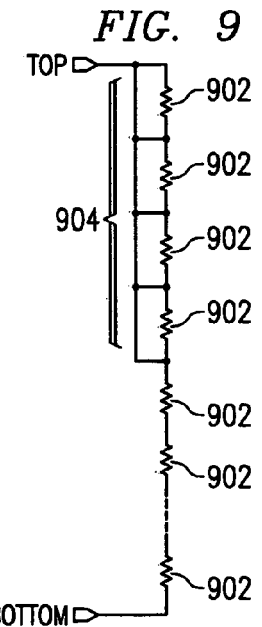
FIG. 9 illustrates a schematic diagram/layout for one of the resistors illustrating the mask programmable feature thereof.

FIG. 9 illustrates a layout for one of the resistors $R_2$-$R_4$. A plurality of series connected resistors are provided that are fabricated in either the substrate with an N-type diffusion or in the Poly1 layer. These resistors provide a mask programmable set of connections 904 to allow one or more resistors 902 to be added into the resistor string, they being initially shorted out. Although not shown, there is also provided the ability to short additional ones of the resistors to decrease the value. This is mask programmable and is utilized to "tweak" the design at the metal level.

Figure 10:
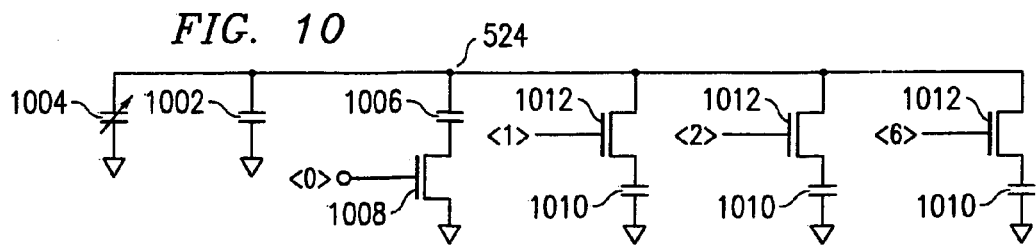
FIG. 10 illustrates a schematic diagram of the programmable capacitor.

Referring now to FIG. 10, there is illustrated a diagrammatic view of the capacitor 526, which is a register programmable capacitor to allow for adjustment of the center frequency. There is provided a nominal capacitor 1002 which has a value of 380 fF, which is connected between node 24 and $V_{SS}$. In parallel therewith, there is also provided a mask programmable capacitor 1004 that provides for eight steps of programming in increments of 39.5 fF. The register programmable capacitors are provided with a capacitor 1006 of value "C" that is connected between a node 524 and one side of the source/drain path of an N-channel transistor 1008, the gate thereof connected to the LSB bit. The configuration of the capacitor 1006 disposed between the switching transistor 1008 and the node 524 is only used for LSB. This structure allows the use of the smaller unit capacitor, but there is some non-linear capacitance that is introduced from the source/drain of the transistor 1008 and, also, the wire bonds. The remaining selectable capacitors are each comprised of a capacitor 1010 which is connected between $V_{SS}$ and one side of the source/drain path of an N-channel transistor 1012, the other side thereof connected to node 524 and the gate thereof connected to the bits [1] through [6]. The value of the capacitor 1010 associated with bit <1> is a value of "C", with the next selectable capacitor 1010 having the associated transistor gate connected to the bit value <2> and the last of the selectable capacitor 1010 having the gate of the associated transistor connected to the bit <6> and a value of 32 C. This is a binary tree, with the LSB providing an LSB of approximately C/2.

Figure 11:
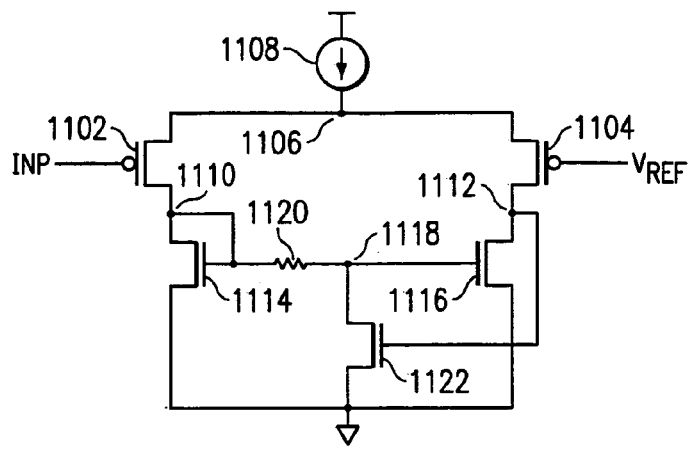
FIG. 11 illustrates a schematic diagram of the comparator.

Referring now to FIG. 11, there is illustrated a diagrammatic view of the differential input structure for each of the comparators 402 and 404. There are provided two differential P-channel transistors 1102 and 1104 having one side of the source/drain paths thereof connected to a node 1106, node 1106 connected through a current source 1108 to $V_{DD}$. The other side of the source/drain path of transistor 1102 is connected to a node 1110 and the other side of the source/drain path of transistor 1104 is connected to a node 1112. The gate of transistor 1102 comprises the positive input and the gate of transistor 1104 comprises the negative input connected to $V_{REF}$. Node 1110 is connected to one side of the source/drain path of an N-channel transistor 1114 and the gate thereof, the other side of the source/drain path of transistor 1114 connected to $V_{SS}$. Node 1112 is connected to one side of the source/drain path of an N-channel transistor 1116, the other side thereof connected to $V_{SS}$ and the gate thereof connected to a node 1118, node 1118 connected to one side of a resistor 1120, the other side thereof connected to the gate of transistor 1114. Node 1112 is also connected to the gate of an N-channel transistor 1122, the source/drain path thereof connected between node 1118 and $V_{SS}$. This structure is referred to as a modified Flynn-Lidholm latching comparator which provides a Set/Reset latch with dynamic logic, described in Flynn M. Lidholm S. U., "A 1.2 µm CMOS Current Controlled Oscillator, IEEE Journal of Solid state Circuits," Vol. 27 No. 7 Jul.1992.

Figure 12:
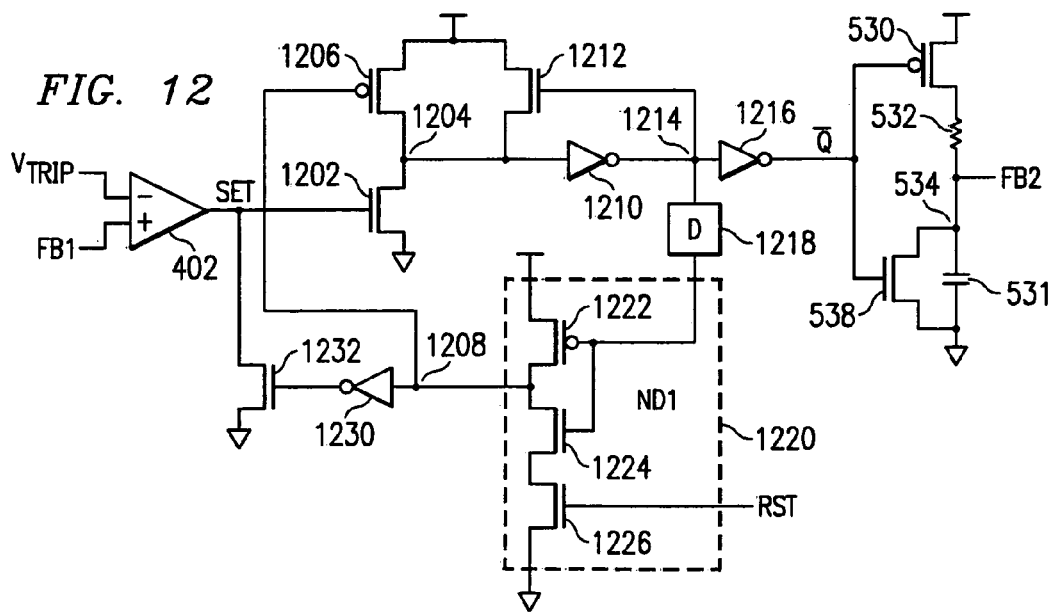
FIG. 12 illustrates a logic diagram for the S/R latch in combination with the comparator.

Referring now to FIG. 12, there is illustrated a diagrammatic view of the comparator 402 and one-half of the S/R latch 408 illustrating the Q-Bar output. The one-half of the S/R latch 408 has the Set input thereof connected to the output of comparator 402 and input to the gate of an N-channel transistor 1202, the source/drain path thereof connected between a node 1204 and $V_{SS}$. A P-channel transistor 1206 has the source/drain path thereof connected between node 1204 and $V_{DD}$, the gate thereof connected to a node 1208. Node 1204 is connected to the input of a conventional inverter 1210 and also to one side of the source/drain path of an N-channel transistor 1212, the other side thereof connected to $V_{DD}$ and the gate thereof connected to a node 1214, which node 1214 is also connected to the output of inverter 1210. Node 1214 is connected to the input of an inverter 1216, the output thereof providing the Q-Bar output. Node 1214 also is connected through a delay block 1218 to the input of a NAND gate 1220 labeled "ND1." NAND gate 1220 is comprised of a P-channel transistor 1222 having the source/drain path thereof connected between $V_{SS}$ and the node 1208 and an N-channel transistor 1224 having the source/drain path thereof connected between the node 1204 and one side of the source/drain path of an N-channel transistor 1226, the other side thereof connected to $V_{SS}$. The gates of transistors 1222 and 1224 are connected to the output of the delay block 1218. The gate of transistor 1226 is connected to the reset input "RST" from the other side of the S/R latch 408. Node 1208 is connected to the input of an inverter 1230, the output thereof driving the gate of an N-channel transistor 1232 having the source/drain path thereof connected between the output of the comparator 402, the SET input of latch 408, and the other side of the source/drain path of transistor 1232 connected to $V_{SS}$. The parallel structure to that associated with the output of comparator 402 in FIG. 12 is provided for the output of comparator 404 for the Reset input.

In operation, when the positive input of comparator 402, FB1, charges up, SET starts to go high. As it reaches the threshold voltage $V_{TH}$ of transistor 1202, Q-Bar begins to go low and, at the same time, the other side of the latch, which has a NAND gate ND2 similar to ND1, begins to go low and pulls down RST. When RST is pulled down, this then sets the Q-output. Initially, it is assumed that Q-Bar is set to a value of "1" and the Q-output is set to "0" with FB1 equaling "0" on comparator 402 and FB2 on the positive input of comparator 404 being initially set to "1" with SET=0 and RST=1. The delay block 1218 prevents ND1 from pulling down the SET value before RST goes low. RST going low ensures that the pull down input is low (or ND1 high) to result in a symmetric process for SET/RST.

Figure 13:
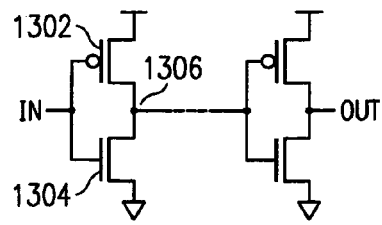
FIG. 13 illustrates a schematic diagram of the delay block.

Referring now to FIG. 13, there is illustrated a schematic diagram of the delay block 1218. This delay block is comprised of a plurality of series connected inverters comprised of two series connected transistors, a P-channel transistor 1302 and an N-channel transistor 1304, with the gates thereof connected together and one side of the source/drain path thereof connected to a node 1306, transistor 1302 connected between $V_{DD}$ and $V_{SS}$.

Figure 14:
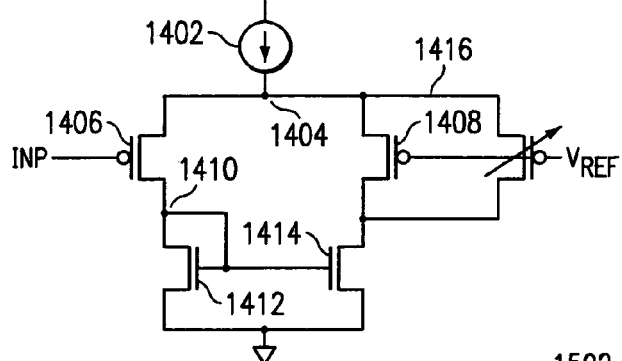
FIG. 14 illustrates a schematic diagram for an offset circuit for the comparator.

Referring now to FIG. 14, there is illustrated a diagrammatic view of a simplified comparator illustrating how supply independence is enhanced. The comparator of FIG. 14 is illustrated with a current source 1402 disposed between $V_{DD}$ and a node 1404, node 1404 connected to one side of two differential connected P-channel transistors 1406 and 1408. The gate of transistor 1406 is connected to one input, whereas the gate of transistor 1408 is connected to the other $V_{REF}$ input. The other side of the source/drain path of transistor 1406 is connected to a node 1410, which is connected to one side of the source/drain path of an N-channel 1412, the other side thereof connected to ground and the gate thereof connected to both the drain thereof on node 1410 and to the gate of an N-channel transistor 1414. Transistor 1414 has the source/drain path thereof connected between the other side of transistor 1408 and $V_{SS}$. Additionally, an offset transistor(s) 1416 of the P-channel type has the source/drain path thereof connected across the source/drain path of transistor 1408, the gate thereof connected to $V_{REF}$ and also to the gate of transistor 1408. Transistor 1416 represents selectable transistors that are mask programmable to select a predetermined offset in the comparator. This offset at the input of the comparators aid in the supply independence. Without offset, the following would be true:

With offset:

$$T_{Period}=2*(-\tau*\ln(1-V_{Trip}/V_{DD})+T_{Delay(comp)})$$

$$T_{Period}=2*(-\tau*\ln(1-\text{ratio})+T_{Delay(comp)})$$

$$V_{Trip}=\text{ratio}*V_{DD}$$

Without offset:

$$V_{Trip}=V_{Trip}+V_{OS}$$

$$T_{period}=2*(-\tau*\ln(1-\text{ratio}-V_{os}/V_{DD})+T_{Delay(comp)})$$

From these equations, it can be seen that $V_{DD}$ dependence has been added. Power supply dependence can be added or subtracted by varying the transistors 1416, noting that there could be variable transistors across transistor 1406 also. This way, the offset can be made negative or positive. Again, this is a mask programmable system.

Figure 15:
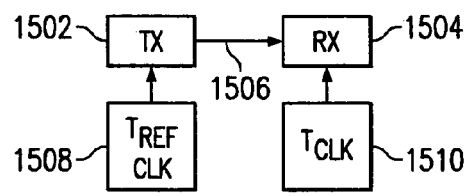
FIG. 15 illustrates a block diagram of two computer peripheral devices.
Figure 16:
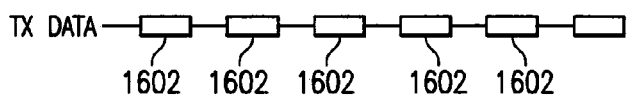
FIG. 16 illustrates the data stream for the USB port.

Referring now to FIG. 15, there is illustrated a block diagram of two computer peripheral devices, a transmit device 1502 and a receive device 1504, separated from each other and connected together through a serial communication line 1506. Illustrated in FIG. 15 is a unidirectional transmission path wherein information is transmitted from the transmitter 1502 over to the receiver 1504. Associated with the transmitter is a transmit clock 1508 labeled $T_{ref}$. The receiver 1504 has associated therewith a receive clock 1510 $T_{clk}$. The data transmitted is illustrated in FIG. 16 wherein there are a plurality of data bursts 1602 that occur over a timeline at different times although they may be repeated with a given periodicity. However, for bursty communications, it is just important to note that the communication actually disappears for a finite amount of time between bursts 1512, such that the receive clock 1510 has a more difficult time capturing the clock information from the receive data.

Figure 17:
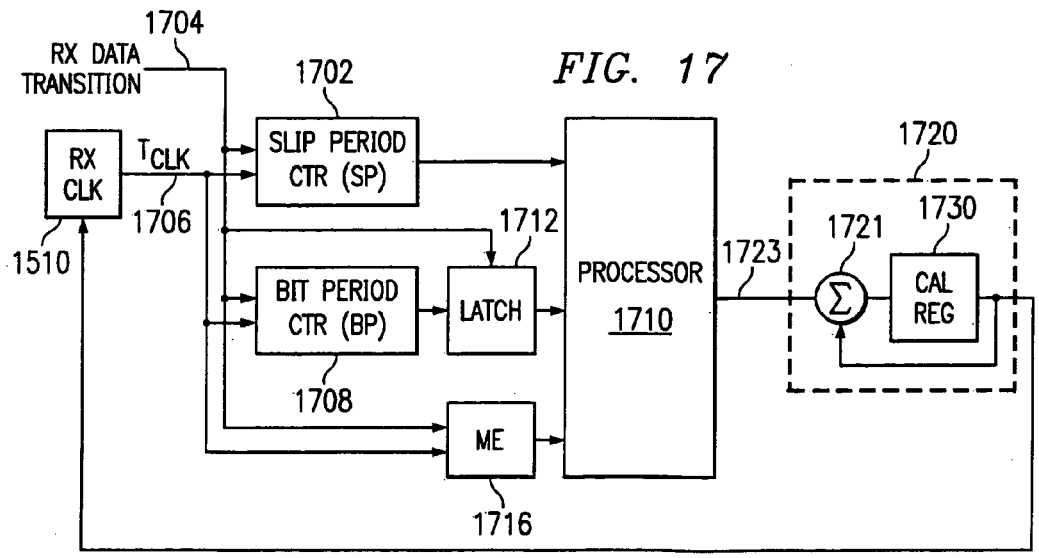
FIG. 17 illustrates an overall block diagram for the system for recovering the clock from the bursty communication.

Referring now to FIG. 17, there is illustrated an overall block diagram for the system for recovering the clock from the bursty communication. The receive clock 1510, as was described hereinabove, is a variable frequency clock and can have the frequency and phase thereof varied. In order to track data transitions and determine if the clock is out of lock, a first counter 1702 is provided, which first counter 1702 is referred to as a Slip Period Counter (SP counter). This counter 1702 is operable to receive as inputs the data transitions on a line 1704 and also the output of the clock circuit 1510 on a line 1706. The receive clock 1510 is operated at a higher rate than the transmit clock, 4× in the present disclosure, to provide an oversampled condition. Therefore, there will be four cycles of the clock 1510 for each cycle of the transmit clock $T_{ref}$. The Slip Period Counter 1702 is operable to initiate a count at a value of "0" upon the detection of the data transition. The counter 1702 will continue to count upward with the most significant bits with only the two least significant bits providing a modulo-4 count, it being understood that this could be any modulus base, i.e., modulo-8, modulo-16, etc. Therefore, the two least significant bits will count from "0" through "3" and then count over again from "0." The value of the two least significant bits is referred to as the phase slip value "PH." In effect, these least two significant bits of the counter 1702 will provide four count values for each cycle of the transmit clock.

As will be described hereinbelow, the slip period counter is reset on the occurrence of a phase slip and is then operable to use the PH value to determine when the next slip occurs. This will happen when a subsequent data transition is sampled and the value of the PH counter is not zero. This indicates that the received data interval is not an integer multiple of the PH clock period over four. For example, the counter 1702 is initiated upon a data transition in the received data. This will cause the count value to be incremented by the receive clock 1510. The first data transition will occur at a PH clock value of "0." If the transmit clock and receive clock are locked and there is no frequency error, and the data transition intervals are integer multiples of the PH clock period over four, then the data transition will always occur on a count value of "0" for the PH clock. However, if one of the clocks is drifting relative to the other of the transmit/receive clocks, then there will come a point in time where the value of the PH clock associated with the occurrence of a data transition may be either "1" for a transmit clock that is slow relative to the receive clock or a "3" value for a transmit clock that is running faster than the receive clock. The SP counter 1702, upon determining that a data transition occurs on PH counter value of other than "0," which constitutes a "slip," will be noted and output to a processor 1710 and then the SP counter 1702 reset.

A second counter, a counter 1708 is provided to count the number of receive clock cycles associated with a "bit period," this referred to as a "BP" counter. The Bit Period is referred to as the number of receive clock cycles that occur between the two data transitions that occur between Mth data and the M-1 data transition of the receive data, wherein the Mth data transition constitutes the data transition determined to be where the slip occurs and the SP counter 1702 was reset. The output of the BP counter 1708 is then latched in a latch 1712, the output thereof provided to the processor 1710. As will be described hereinbelow, the contents of the latch comprise the count for the last bit period for both the current slip period and the immediately previous slip period.

In addition to determining the SP and BP count values, there will also be provided a master error (ME) block 1716, which is utilized to calculate an error value. This utilizes both the data transition and the clock signal on lines 1704 and 1706. This is provided to the processor 1710.

The processor 1710 will utilize the slip indication from the SP counter 1702, in addition to the value thereof, the contents of the latch 1712 and the contents of the ME block 1716 in order to determine both the direction of an oscillator correction and also the magnitude of that correction required to effect a change in the receive clock 1510 to reduce the frequency error between the receive and transmit clocks. This is then output to an oscillator correction block 1720 that provides the correction control to the receive clock 1510. This is to be contrasted with a standard phase lock loop that utilizes an iterative procedure wherein it calculates an error and then steps the oscillator in one direction or the other to again determine the error. The steps are typically constant steps. In the disclosed embodiment, the processor 1710 actually determines a value and a direction for the step. The correction block 1720 is comprised of a signed adder. This includes a summer 1721 that receives the error $\epsilon_{osc}$ on an input 1723, the output of the summer 1721 input to a calibration register block 1730. The output of the calibration register block 1730 is then input to the other input of the summer 1721 and provides the frequency input to the oscillator 1510.

In the clock recovery of the present disclosure, the period between incoming transitions is assumed to be an integer multiple of the period of the reference clock $T_{ref}$ since a requirement of clock recovery is the ability to generate a reliable measure of a frequency error between the local oscillator and the reference or transmit oscillator. The present system utilizes the quantized nature of the incoming transition periods in order to generate a measure of the error. For example, if each of the incoming transitions is measured using the SP counter 1702 running at K times the local clock, then each transition should occur on the same modulo-K boundary of this SP counter 1702 when the receive and transmit clock are at the same frequency. However, as noted hereinabove, if the receive clock is slightly faster, the counter value modulo-K sampled at each incoming transition will tend to "walk" in the positive direction. Likewise, if the receive clock is slightly slower, the modulo-K sampled transition will tend to walk in the negative direction.

Referring now to FIG. 18, there is illustrated a diagrammatic view of how the SP counter operates relative to the PH modulo-K counter. It can be seen that the SP counter is initiated at a value of "0" and then counts upward. The PH counter is also reset to zero at the same time as the SP counter, since this basically comprises the least two significant bits of the SP counter 1802, and begins counting from "0" through "3." This continually recycles, such that, for example, each multiple of 4 will result in a value of "0," such as at the values "8" and "12."

Referring now to FIG. 19, there is illustrated a diagram of the SP count value from a value of "0" to a value of "SP." If one transition is sampled at PH≠0 and a subsequent transition is sampled at PH=1, this is referred to as "phase slip," which implies that the receive clock is faster than the reference clock. How much faster is not known, since even a slight mismatch in the clocks would eventually create this situation. In FIG. 19, the first transition is illustrated as occurring at the beginning of the SP count, this having been initiated by detecting a slip in a previous SP count value, as will be described in more detail hereinbelow. At a first count cycle 1902 for a count value of "0," the transition could have been sampled anywhere within the clock cycle between the beginning of the count cycle to the next clock edge that will increment the counter. This is measured as a distance from the initial edge, an edge 1904 defined by the receive clock, to a transition edge 1906, defined by the transmit clock $T_{ref}$, which has a value relative to the receive clock, $T_{clk}$, of $a \cdot T_{clk}$. The receive system will continue to sample the transitions until a phase slip is detected. This will occur at the last value in a slip period, SP, at a transition 1908, again this transition determined by the transmit clock $T_{ref}$. Transitions 1906 and 1908 are separated by an integer number of transmit clocks, N, giving an interval of $N \cdot T_{ref}$. This second transition will occur somewhere within a last count cycle 1910 of the SP counter 1702. However, again, the position within the count cycle from one receive clock edge to the receive data transition is unknown. It is defined relative to the receive clock as a value of $b \cdot T_{clk}$. Knowing the time between phase slips and the value of the phase slip provides the frequency error, i.e., the change in phase over the change in time. However, it is noted that a phase slip pf "1" could represent jut greater than "0" to just less than "2" phase slips, due to the uncertainty $a_{clk}$. The oscillator has a know maximum error and, therefore, if the transitions occur far enough apart in time such that the phase slip will be too large and exceed this error, then this measurement will be ignored. This condition can exist due to the bursty nature of the data and the potential for large dead times, resulting in the potential for too large a time between transitions. If not ignored, this could result in a frequency correction that would be of the wrong magnitude and/or sign.

Referring now to FIG. 20, there is illustrated a more detailed diagrammatic view of the receive data transitions relative to the SP counter. The counter is reset at a value of zero at a first count cycle 2002 which is coincident with the occurrence of a receive data transition 2006 that is disposed a value of a $T_{clk}$ from the leading edge of the count cycle 2002. The transition 2006 is labeled $T_1$. An nth transition 2004 labeled $T_n$ is illustrated as occurring during the count cycle 2008 of the SP counter 2202 having a value of "41" with a PH value of "1," indicating a phase slip of one SP clock. The transition 2004 is disposed a distance $b \cdot T_{clk}$ from the leading edge of the count cycle 2008. If the clocks were locked, such that $NT_{ref} = NKT_{clk}$ with no relative phase shift, then this would result in a transition 2004' for an nth transition $T'_n$ in a count cycle block 2010 with a value of "40" and a PH value of "0," indicating no phase slip. The distance of the transition 2004' from the edge of the count cycle block 2010 would be equal to $a \cdot T_{clk}$, such that the time between transition 2006 and transition 2004' would be $NKT_{ref}$. However, since there is a phase slip of the clock, then the value from the leading edge of SP clock 2002 would be $N_{clkf}+(b-a+1) \cdot T_{clk}$, resulting in an error 2012. This error can be utilized to adjust the clock, if both the sign of that error is known and the magnitude of that error is known. The reason for this error is that each incoming transition in the SP counter includes the uncertainty factors (a & b) which range from zero to one. The measured error between the clocks can be derived as:

$$aT_{clk} + N \cdot T_{ref} = SP \cdot T_{clk} + bT_{clk} \quad \quad 1.$$

$$\frac{T_{clk}}{T_{ref}} = \frac{N}{SP + b - a} \quad \quad 2.$$

$$\frac{T_{ref}(1+\varepsilon)}{KT_{ref}} = \frac{N}{SP + b - a} \quad \quad 3.$$

$$\varepsilon = \frac{KN}{SP + b - a} - 1 = \frac{KN - SP - b + a}{SP + b - a} \quad \quad 4.$$

$$\varepsilon = \frac{PH - b + a}{SP + b - a} \quad \quad 5.$$

$$\frac{PH - 1}{SP + 1} < \varepsilon < \frac{PH + 1}{SP - 1} \quad \quad 6.$$

Note that, in these equations, PH is treated as a 2's complement value, i.e., 3=-1, etc. In equation 6, it is noted that for small absolute values of PH (-1,1), that only the sign information is known and the error magnitude is still unknown. The BP counter 1708 is utilized to help recover the magnitude information. In addition, using the BP counter and the SP counter, it is known that there are either two positive phase changes in a row or two negative phase changes. If there is a positive and then a negative or just the reverse, then the error is ignored.

Figure 21:
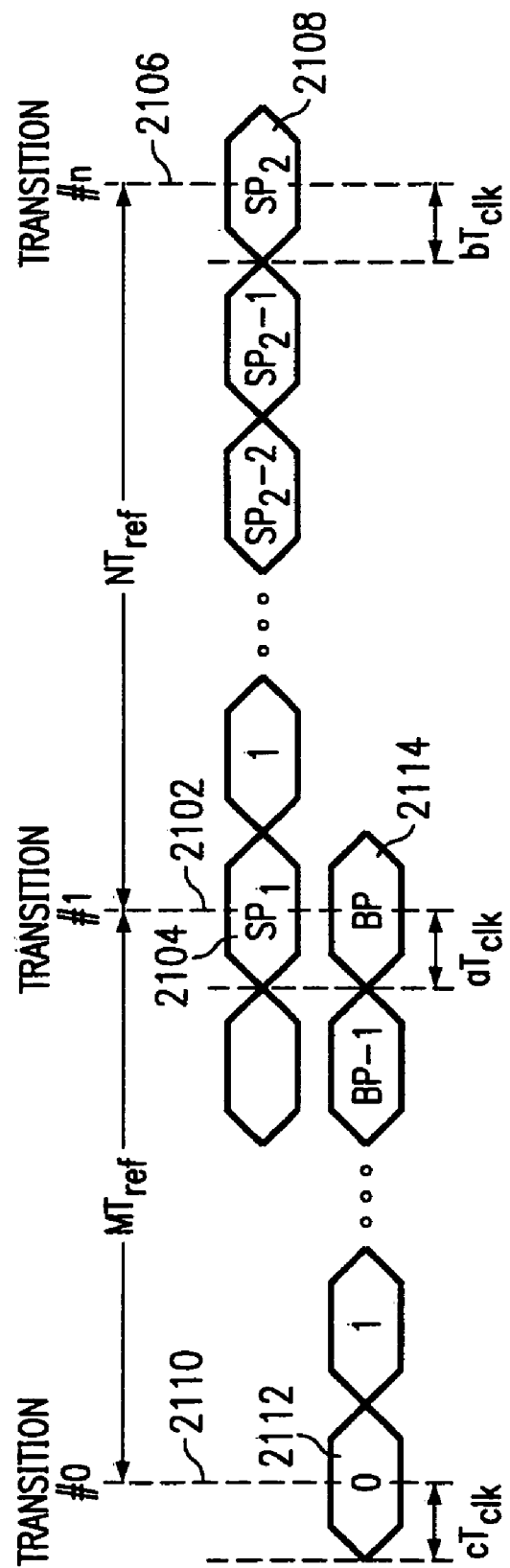
FIG. 21 illustrates a diagrammatic view of the operation of the SP counter and the BP counter.

Referring now to FIG. 21, there is illustrated a diagrammatic view of the operation of the SP counter 1702 and the BP counter 1708. The value for the BP counter comprises the last Bit Period that occurred prior to and up to the resetting of the SP counter 1702. For illustration purposes, there are illustrated two Slip Periods, a first Slip Period having a value from zero to $SP_1$ and a second Slip Period having a value from zero to $SP_2$. The first Slip Period will have its final count value $SP_1$ occur upon a transition 2102 and the data that occurs for a PH value that is other than "0" (not shown). This will occur in a count cycle 2104. At this time, the SP counter 1702 is reset to a value of "0," such that the count cycle 2104 constitutes the first count cycle of the second Slip Period and the value of PH therefore will be set to "0." This will continue to count up for an integral multiple of the transmit clock until a transition 2106 occurs that is associated with the PH value of other than "0" in a count cycle 2108. Again, the first transition 2102 occurs a distance of $a \cdot T_{clk}$ from the leading edge of the count cycle 2104 and the transition 2106 occurs at a distance $b \cdot T_{clk}$ from the leading edge of the count cycle 2108.

With respect to the BP counter 1708, the transition 2102 that resulted in resetting of the SP counter 1702 for the first Slip Period occurred an integral multiple of the $T_{ref}$ clock from a prior transition 2110. This prior transition 2110 is the immediately preceding transition to data transition 2102. However, it should be understood that this data transition could occur at any multiple of the transmit clock, depending upon the communication protocol utilized. The BP counter 1708 is reset on each transition of the data, such as transition 2110 for the last Bit Period in the first Slip Period in a count cycle 2112, a distance of $c \cdot T_{clk}$ from the leading edge of the count cycle 2110. The BP counter 1708 will be incremented up to a value BP in a count cycle 2114 that corresponds to the SP count cycle 2104. This will be a distance of $a \cdot T_{clk}$ from the leading edge thereof. When the transition 2102 occurs and a slip is detected, the BP count value is stored and this value is utilized to calculate the clock error.

Similar to the previous case, for this case, the clock error can be calculated as follows:

$$cT_{clk} + M \cdot T_{ref} + N \cdot T_{ref} = BP \cdot T_{clk} + SP_2 \cdot T_{clk} + bT_{clk} \quad \quad 7.$$

$$\frac{T_{clk}}{T_{ref}} = \frac{M + N}{BP + SP_2 + b - c} \quad \quad 8.$$

$$\frac{T_{ref}(1+\varepsilon)}{KT_{ref}} = \frac{M + N}{BP + SP_2 + b - c} \quad \quad 9.$$

$$\varepsilon = \frac{KM + KN - BP - SP_2 - b + c}{BP + SP_2 + b - c} \quad \quad 10.$$

$$\varepsilon = \frac{PH_1 + PH_2 - b + c}{BP + SP_2 + b - c} \quad \quad 11.$$

It can be shown that $(KN-SP_2)=PH_2$ and $(KM-BP)=PH_1$, such that:

$$\frac{|PH_1 + PH_2| - 1}{BP + SP_2 + 1} < |\varepsilon| < \frac{|PH_1 + PH_2| + 1}{BP + SP_2 - 1} \quad \quad 12.$$

$PH_1$ and $PH_2$ are those values associated with $SP_1$ and $SP_2$, respectively.

Equation 12 defines the bounds of the error as to the magnitude thereof. The sign has already been determined and this equation, for any non-zero value of $PH_1$ and $PH_2$, results in a non-zero lower limit on a clock error that can be calculated.

Therefore, a frequency correction of up to twice this lower limit can be made to the local clock without risking an increase in the resulting absolute error. The reason for this is that a determined error of, for example, +1.5% on the lower limit could be adjusted by up to 3% in the opposite direction that would result in the clock then having a −1.5% error, which would result in no worse error. The correction factor that is generated is as follows:

$$\varepsilon_{osc} = \text{SIGN}(PH_1 + PH_2)\left(\frac{|PH_1 + PH_2| - 1}{BP + SP_2 + 1}\right)(1 + o) \qquad 13.$$

where o is the maximum allowed overshoot and the sign of the correction is the same as that of the PH values. This equation 13 therefore provides both the sign and the magnitude for a given overshoot factor "o."

The derivations above use the relationship that $(KN-SP_2)=PH_2$. However, since we sample the value of $PH_2$ on incoming transitions, aliasing can occur thus making this relationship invalid. The rate of change of $PH_2$ relative to edges on $T_{ref}$ is equivalent to the clock error over $KT_{clk}$. Thus the Nyquist Limit requires that:

$$\frac{1}{BP \cdot T_{clk}} > 2 \frac{\varepsilon}{KT_{clk}} \qquad 14.$$

Where BP is the number of $T_{clk}$ periods between incoming transitions. In general, the maximum value of BP which avoids aliasing is given by:

$$BP_{\max} < \frac{K}{2\varepsilon} \qquad 15.$$

Transitions which result in a BP count longer than this amount should be ignored to avoid errors. Notice that in order to know when to reject incoming transitions, an upper limit on the clock error must be known. Although a worst-case error could be used based on the starting oscillator tolerance, this would tend to decrease the bandwidth of the tracking loop by rejecting more transitions, thus increasing the time required to reduce the clock error to within acceptable limits. An alternative is to maintain an upper limit for the clock error calculated from incoming transitions (named ME). This limit can then be used to calculate the value of $BP_{max}$. This upper limit can be initialized to the worst-case oscillator error. As incoming transitions are observed, ME can be reduced, thus increasing $BP_{max}$ and allowing larger gaps between useful transitions. This is of particular importance when dealing with bursty communications systems, such as USB. Calculation of ME will be described hereinbelow.

Although the above equation is correct in general, further considerations can be used to refine the $BP_{max}$ calculations. For example, since the SP and hence PH values are reset to "0" after each incoming transition, this effectively locks the phase of $T_{ref}$ with PH. Therefore, for a given sampled value of PH, a specific value for $BP_{max}$ can be calculated which prevents aliasing for that specific PH value. This is accomplished by considering how the phase error between $T_{ref}$ and PH accumulates over time. This accumulated error must be limited to prevent the sampled value of PH from wrapping. Although in general this implies the phase error must remain less than 180 degrees, since $T_{ref}$ and PH are phase-locked on each transition, the allowed phase error can exceed 180 degrees in some cases. The error accumulated over M $T_{ref}$ periods is given by:

$$\Delta T = aT_{clk} + M(KT_{clk} - T_{ref}) \qquad 16.$$

where a is the initial phase error. To avoid aliasing, this error must not exceed the cardinal distance between K and PH (named D). Therefore:

$$aT_{clk} + M(KT_{clk} - T_{ref}) < DT_{clk} \qquad 17.$$

where D is given by:

$$D = \begin{cases} K - |PH| & \text{if } |PH| < \frac{K}{2} \\ 2K - |PH| & \text{if } |PH| = \frac{K}{2} \end{cases} \qquad 18.$$

Using:

$$T_{ref} = KT_{clk}/(1+\varepsilon) \qquad 19.$$

and solving for M gives:

$$M < \frac{(D-a)}{K} \frac{(1+\varepsilon)}{\varepsilon} \qquad 20.$$

Using the relationship between the clocks and a worst-case value of "1" for a, this can be written in terms of $BP_{max}T_{clk}$ periods as:

$$BP_{\max} < \frac{D-1}{\varepsilon} \qquad 21.$$

Note that this value of $BP_{max}$ is the largest value allowed which rejects aliasing transitions. However, due to the quantized nature of PH values, a lower limit on $BP_{max}$ can be calculated which guarantees no valid transition for a given sampled value of PH will be rejected. This is obtained by requiring the accumulated error always exceed the cardinal distance between PH and 0 plus 1, written as:

$$aT_{clk} + M(KT_{clk} - T_{ref}) > (PH+1) \cdot T_{clk} \qquad 22.$$

This can be solved in terms as $BP_{max}$ using a value of 0 for a as:

$$BP_{\max} > \frac{|PH| + 1}{\varepsilon} \qquad 23.$$

For a given implementation of this clock recovery algorithm, using any value of $BP_{max}$ which satisfies both limits will prevent aliasing without rejecting acceptable incoming transitions. The actual value used can be chosen within these limits in a manner which reduces hardware complexity.

As discussed above, a measure of the maximum clock error is required for proper rejection of aliasing transitions. Starting with Eqn. 6, the maximum absolute error can be written as:

$$|\varepsilon_{max}| < \begin{cases} \frac{|PH-1|}{SP+1} & \text{if } PH < 0 \\ \frac{PH+1}{SP-1} & \text{if } PH \geq 0 \end{cases} \qquad 24.$$

In order to simplify the hardware, this can approximated without loss of generality as:

$$|\varepsilon_{max}| < \frac{|PH|+1}{SP-1} \qquad 25.$$

The maximum error register (named ME) can be initialized with the worst-case initial oscillator error. On each valid incoming transition, the current value of SP can be used to calculate a new absolute value Of $\xi_{max}$. If this new term is less than ME, ME can be reduced to this new value. $BP_{max}$ can then be calculated using $\xi$=ME. This measure of the maximum error improves over time, thus allowing larger gaps between incoming transitions before aliasing can occur. Note that if a worst-case oscillator drift over time is known, the value of ME can be increased by a correction factor at regular intervals in order to account for this drift.

Figure 22:
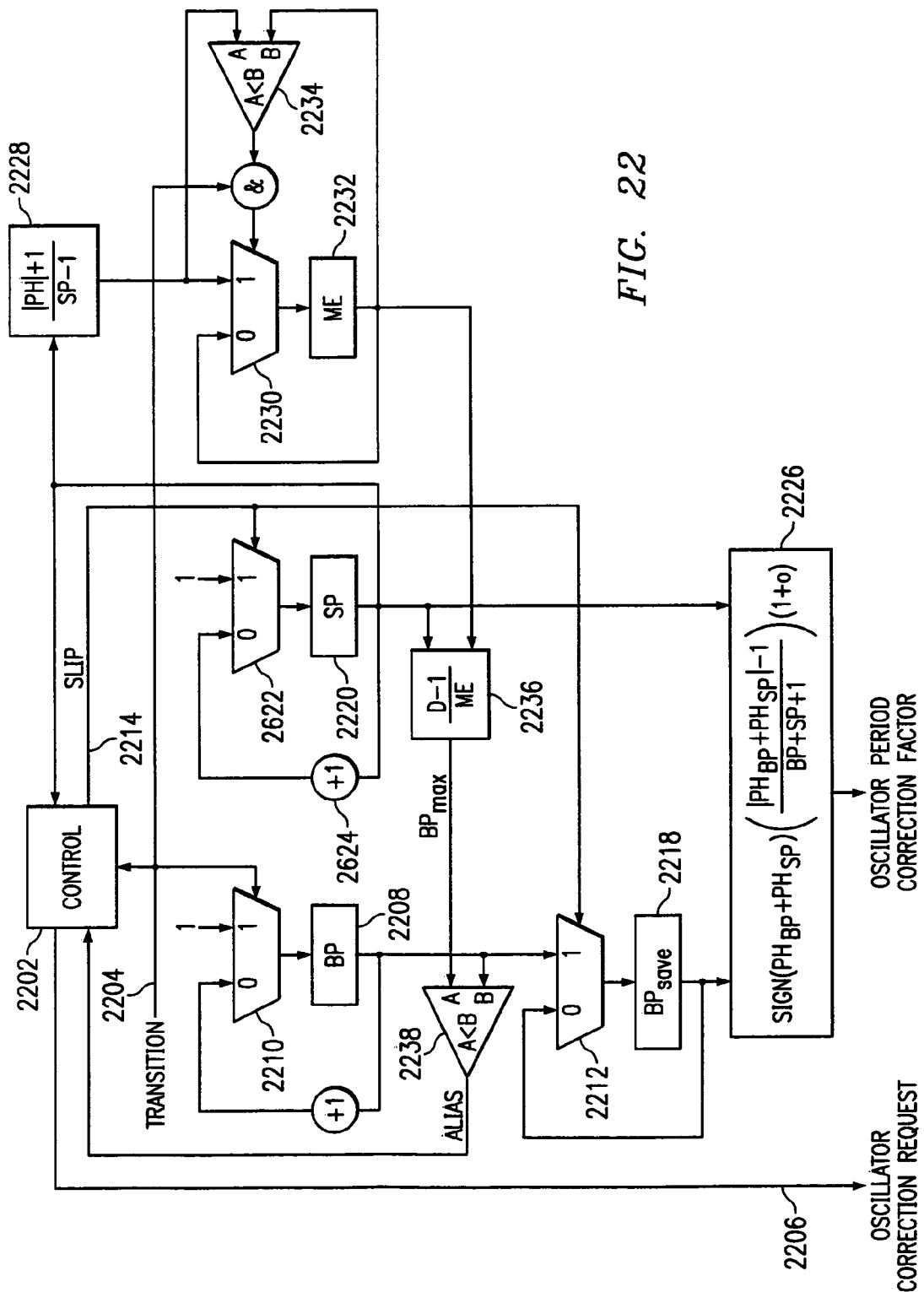
FIG. 22 illustrates an overall block diagram of the bursty communications clock recovery method.

Referring now to FIG. 22, there is illustrated a block diagram illustrating the counters and the implementation of the various equations noted hereinabove that are required to implement the clock recovery algorithm of the present disclosure. A general control block 2202 is provided that is operable to receive the data transition on a transition line 2204 and generate on an output therefrom an oscillator correction request on a line 2206. The BP counter 1708 is illustrated as having an accumulating register 2208 that receives as an input the output of a two input multiplexer 2210. The multiplexer 2210 is controlled by the data transition to, upon the occurrence of a data transition, select a "1" for a reset operation and, in the absence of a data transition, a feedback increment loop is selected which, upon each clock cycle of the receive clock, will increment the value in the BP latch 2208. The operation is such that the value stored in the BP latch 2208 will be loaded into one input of a multiplexer 2212 on the "1" input which multiplexer 2212 is controlled by a slip detection output 2214 from the control block 2202 that will cause the value of the BP latch 2208 to be loaded into a $BP_{save}$ latch 2218. In the absence of the Slip Signal, the output of the latch 2218 is fed back to the "0" input of the multiplexer 2212, such that it is continually maintained in the latch 2218.

The SP counter 1702 is realized with an SP latch 2220 that receives as the input thereof the output of the two input multiplexer 2222, the "1" input connected to a fixed reset value of "1," the multiplexer providing a reset when the Slip Signal is indicated on line 2214. In the absence of the Slip Signal, the output of latch 2220 is fed to an increment block 2224 that is fed back to the "0" input of multiplexer 2222 such that, for each clock cycle, the value of the SP counter 2220 is incremented. Upon the occurrence of a Slip Signal, the output of the latch 2220 is input to an algorithm block 2226 to execute equation 13 to determine the oscillator period correction factor, as well as the value out of the $BP_{save}$ register 2218. These two values are utilized to perform this operation.

The output of the SP latch 2220 is also input back to the control block 2202 to determine the PH values therefor. These PH values are what are utilized to determine if a slip has occurred. This SP output value is also input to a maximum error calculation block 2228 to calculate the maximum error value, the output of block 2228 input to the A-input of block 2234. This is input to the "1" input of a two input multiplexer 2230, the output of which feeds an ME register 2232 that provides the ME output. This is input back to the "0" input of the multiplexer 2230. The output of the calculation block 2228 is also input to a comparator block 2234 having A and B inputs which B input is connected to the output of the ME latch 2232, it being understood that the initial value of the ME latch 2232 is the maximum error value that is predetermined for the system. The block 2234 is operable to determine if the value of A is less than the value of B. If so, this is logically ANDed with the transition input 22 so, if both the condition that A is less than B and the data transition occurs at the same time, then this causes the value calculated in block 2228 to be loaded into the ME block 2232. The output of ME latch 2232 is then input to a calculation block 2236 which also receives the output of the SP latch 2224 calculating the anti-aliasing value and determining the value of $BP_{max}$. This is input to the A-input of a comparator block 2238, the B-input connected to the output of the BP latch 2208. If the A-input is determined to be less than the B-input, this indicates that there is an alias condition, which is indicated back to the control block 2202 for the purpose of possibly determining that the slip indication has not actually occurred and it will be ignored.

Figure 23:
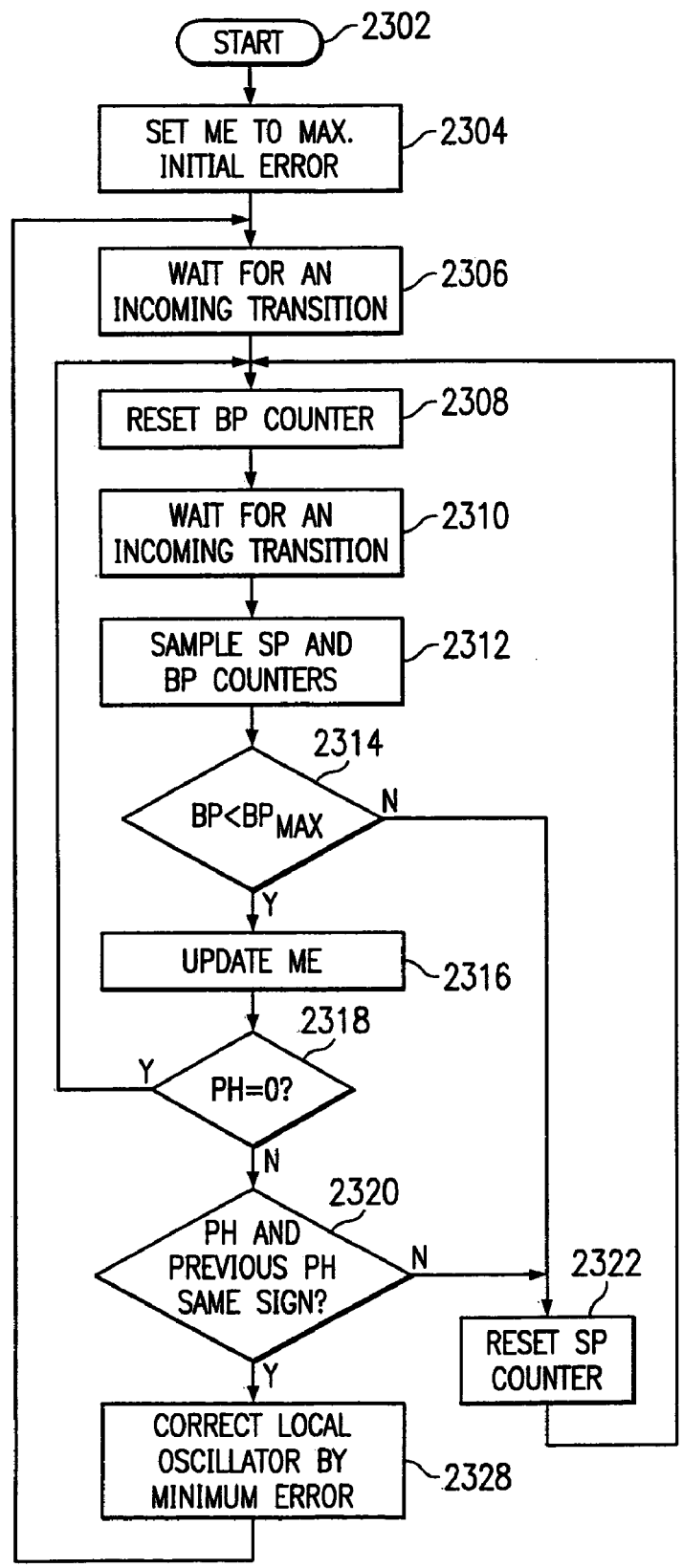
FIG. 23 illustrates a simplified flowchart depicting the basic control steps of the bursty communications method.

Referring now to FIG. 23, there is illustrated a simplified flowchart depicting the basic control steps. The program is initiated at a Start block 2302 and then proceeds to a function block 2304 to set the value of ME to a maximum initial error and then to a function block 2306 to wait for an incoming transition. When the incoming transition occurs, the BP counter is reset, as indicated by function block 2308. The program then flows to a function block 2310 to wait for the next transition. When the next transition occurs, both the SP counter and the BP counter are sampled, as indicated by a function block 2312. The program then flows to a decision block 2314 to determine if the value of BP is less than the value of $BP_{max}$. If so, the program will flow along a "Y" path to a function block 2316 to update the value of ME and then to a decision block 2318 to determine if the value of PH is equal to zero. If not, this indicates a slip and then the program proceeds to a decision block 2320. If yes, then the program will flow back to the input of the function block 2308. Similarly, if anti-aliasing is required and BP is determined to be not less than $BP_{max}$ at decision block 2314, then the program will flow to a function block 2322 from decision block 2314 to reset the SP counter and then back to the input of function block 2308. However, when the PH value is determined not to be zero, i.e., a slip condition, then the program flows to decision block 2320, and a decision is made as to whether a current value of PH and the previous value of PH have the same sign. If not, the program will flow to function block 2322 in order to reset the SP counter and if so, the program will flow along the "Y" path to a function block 2328 to correct a local oscillator by the minimum determined error.

Implementation of the algorithm described above is largely an exercise in managing quantization and finite-register effects. For example, the oscillator correction factor must be specified as an integer multiple of the oscillator's inherent period resolution. Also, since the logic must never increase the relative error, the oscillator's maximum possible unit step size must be used in the calculations. This value is defined in the RTL code as:

$$MAXOSCSTEP = \frac{1}{\varepsilon_{step}} \qquad 26.$$

The initial worst-case oscillator error ($\epsilon_{init}$) is defined as a multiple of $\epsilon_{step}$, i.e.:

$$MAXINITERROR = ceil\left(\frac{\varepsilon_{init}}{\varepsilon_{step}}\right) = ceil(MAXOSCSTEP \cdot \varepsilon_{init}) \qquad 27.$$

The maximum allowed overshoot is defined as a multiple of 25%, i.e.:

$$OVERSHOOT = 4o \qquad 28.$$

Finally, the Maximum Error (ME) is maintained as an integer multiple of $\epsilon_{ME}$ (a fixed fraction of $\epsilon_{step}$), defined by ERROR-STEP as:

$$ERRORSTEP = \frac{\varepsilon_{step}}{\varepsilon_{ME}} = \frac{1}{MAXOSCSTEP \cdot \varepsilon_{ME}} \qquad 29.$$

The width of the various counters is limited in general by the maximum values for which a non-aliasing calculation would be performed.

The remaining implementation issue is how to avoid the division inherent in most of the equations described herein. For the value of K=4 used in the implementation, most of the equations only have eight or fewer unique values. This allows the divisions to be precomputed. For example, consider the calculation of the oscillator correction factor:

$$|\varepsilon_{osc}| = \left(\frac{PH_1 + PH_2 - 1}{BP + SP_2 + 1}\right)(1+o) \qquad 30.$$

This can written as:

$$BP + SP_2 = \left(\frac{PH_1 + PH_2 - 1}{|\varepsilon_{osc}|}\right)(1+o) - 1 \qquad 31.$$

Now, for K=4 the only interesting cases correspond to ($PH_1 + PH_2$)=±2 (the case of ($PH_1+PH_2$)=±3 is approximated as ±2 to simplify the hardware). Therefore, the equation can be written as:

$$BP + SP_2 = \left(\frac{1+o}{|\varepsilon_{osc}|}\right) - 1. \qquad 32.$$

The value of $\epsilon_{osc}$ can be quantized to 3 bits since $2^3\epsilon_{step} > \epsilon_{init}$. Therefore, the oscillator correction factor can be calculated as:

$$|\varepsilon_{osc}| = \begin{cases} 7 & \text{if } BP+SP_s < \left(\frac{1+o}{7\varepsilon_{step}}\right) - 1 \text{ else} \\ 6 & \text{if } BP+SP_2 < \left(\frac{1+o}{6\varepsilon_{step}}\right) - 1 \text{ else} \\ 5 & \text{if } BP+SP_2 < \left(\frac{1+o}{5\varepsilon_{step}}\right) - 1 \text{ else} \\ 4 & \text{if } BP+SP_2 < \left(\frac{1+o}{4\varepsilon_{step}}\right) - 1 \text{ else} \\ 3 & \text{if } BP+SP_s < \left(\frac{1+o}{3\varepsilon_{step}}\right) - 1 \text{ else} \\ 2 & \text{if } BP+SP_s < \left(\frac{1+o}{2\varepsilon_{step}}\right) - 1 \text{ else} \\ 1 & \text{if } BP+SP_s < \left(\frac{1+o}{1\varepsilon_{step}}\right) - 1 \text{ else} \\ 0 \end{cases} \qquad 33.$$

This corresponds to a set of seven comparators plus some encoding logic in hardware.

Figure 24:
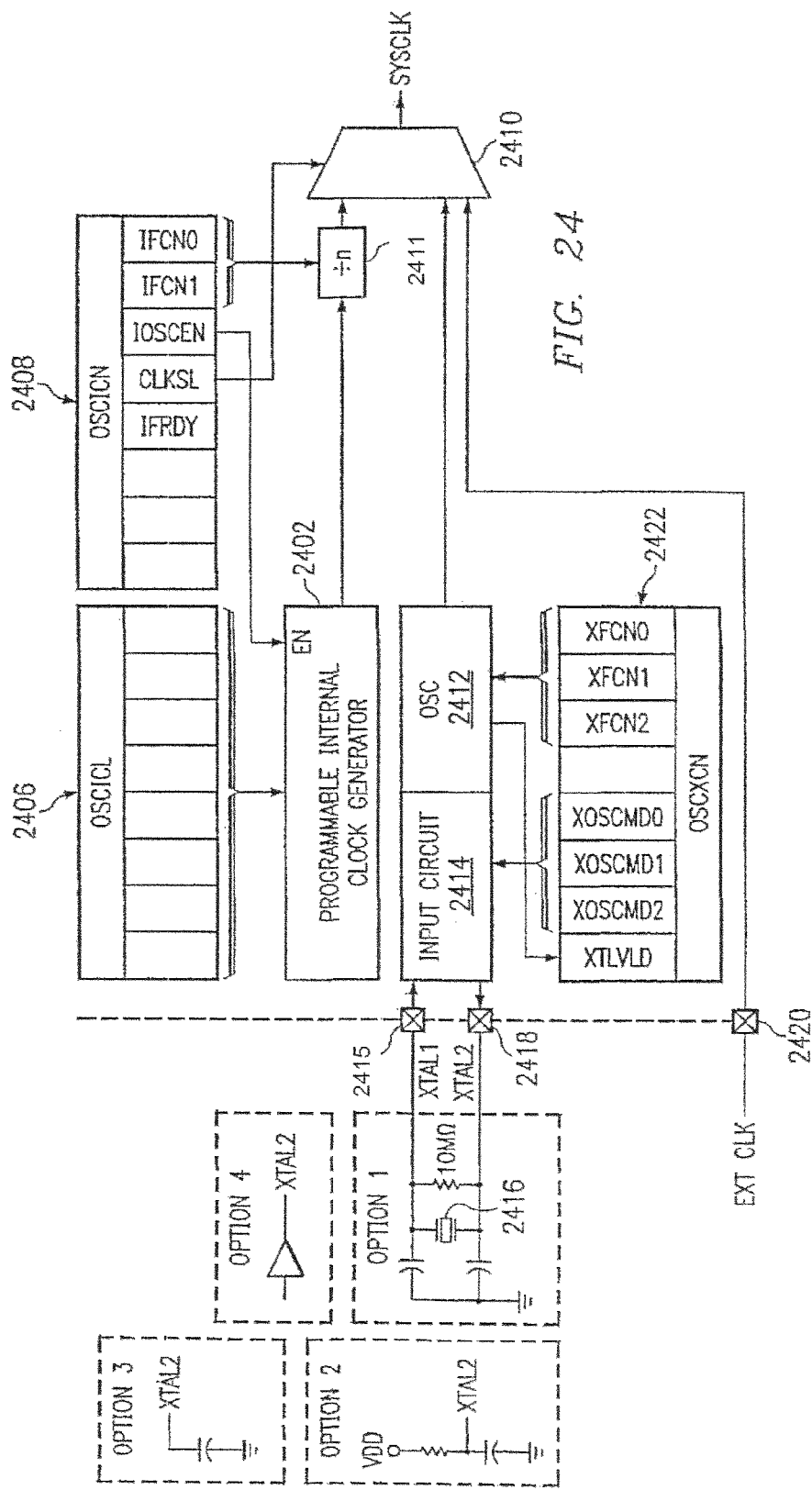
FIG. 24 illustrates a block diagram of one instantiation of the oscillator.

Referring now to FIG. 24, there is illustrated a diagrammatic view of one instantiation of the precision oscillator. In the oscillator implemented on the integrated circuit, a programmable internal clock generator 2402 is provided that is controlled by a register 2406 and a register 2408. The output of the internal clock generator is input to a divide circuit 2411, which is also controlled by the register 2408, the output thereof being input to one input of a multiplexer 2410. This multiplexer 2410 is controlled by the register 2408. Multiplexer 2410 outputs the system clock (SYSCLK), which is input to the baud rate generator 302. In addition to an internal clock generator, there is also a provision for an external crystal controlled oscillator. A crystal controlled internal or on-chip oscillator 2412 is provided that is interfaced through an input circuit 2414 to terminals 2415 and 2418 to an external crystal 2416. The output of the oscillator 2412 is input to one input of the multiplexer 2410. Additionally, an external clock is provided on a terminal 2420 that is also input to one input of the multiplexer 2410. The crystal controlled oscillator 2412 is controlled by a register 2422.

The internal oscillator is provided such that it will be the default system clock after a system reset. The internal oscillator period can be programmed with the register 2406 by the following equation:

$$\Delta T \cong 0.0025 \times \frac{1}{f_{BASE}} \times \Delta OSCICL$$

wherein $f_{BASE}$ is a frequency of the internal oscillator followed by a reset, $\Delta T$ is the change in internal oscillator, and $\Delta OSCICL$ is a change to the value held in the register 2406. Typically, the register 2406 will be factory calibrated to a defined frequency such as, in one example, 12.0 MHz.

Referring now to FIG. 25, there is illustrated a table for register 2406 wherein it can be seen that bits 6-0 are associated with the calibration register of the oscillator and its value can be changed internally. FIG. 26 illustrates the control register 2408 illustrating the controls provided therefor.

Although the preferred embodiment has been described in detail, it should be understood that various changes, substitutions and alterations can be made therein without departing from the spirit and scope of the invention as defined by the appended claims.

What is claimed is:

1. An integrated circuit device comprising:
an internal programmable clock generator for generating a programmable clock signal;
a serial communications interface adapted to receive bursty data streams from an external source; and
a programmable microprocessor core adapted to obtain a system clock signal from the programmable clock signal;
wherein the serial communications interface is adapted to recover a source clock signal from a data burst stream utilizing the programmable clock signal as a reference clock for recovery of the data, which programmable clock signal has the frequency thereof adjusted to correspond to the recovered source clock signal.

2. The device of claim 1 wherein the serial communications interface comprises a Universal Serial Bus (USB) controller and a USB transceiver.

3. The device of claim 2 wherein the serial communications interface further comprises a Universal Asynchronous Receiver/Transmitter (UART) adapted to receive bursty communications data from the USB transceiver and further adapted to recover the source clock signal from the bursty data utilizing the programmable clock signal as a reference clock.

4. The device of claim 1 wherein the programmable clock generator comprises a mask-programmable resistive-capacitive (RC) network.

5. The device of claim 4 wherein the programmable clock generator is temperature-compensated.

6. The device of claim 4 wherein the programmable clock generator comprises at least one register-programmable capacitor configured to adjust a center frequency of the programmable clock signal.

7. The device of claim 1 wherein the microprocessor core and the serial communications interface are adapted to receive clock signals from an external source.

8. A method of constructing an integrated circuit device, comprising the steps of:
providing an internal programmable clock generator for generating a programmable clock signal;
providing a serial communications interface adapted to receive bursty data streams from an external source;
providing a programmable microprocessor core adapted to obtain a system clock signal from the programmable clock signal; and
configuring the serial communications interface to recover a source clock signal from a data burst stream utilizing the programmable clock signal as a reference clock for recovery of the data, which programmable clock signal has the frequency thereof adjusted to correspond to the recovered source clock signal.

9. The method of claim 8 wherein the step of providing a serial communications interface comprises providing a Universal Serial Bus (USB) controller and a USB transceiver.

10. The method of claim 9 wherein the step of providing a serial communications interface further comprises providing a Universal Asynchronous Receiver/Transmitter (UART) configured to receive bursty communications data from the USB transceiver and further configured to recover a source clock signal from the bursty data utilizing the programmable clock signal as a reference clock.

11. The method of claim 8 wherein the step of providing a programmable clock generator further comprises providing a mask-programmable resistive- capacitive (RC) network.

12. The method of claim 11 wherein the step of providing a programmable clock generator further comprises providing temperature compensation in the programmable clock generator.

13. The method of claim 11 wherein the step of providing a programmable clock generator further comprises providing at least one register-programmable capacitor configured to adjust a center frequency of the programmable clock signal.

14. The method of claim 8 wherein the microprocessor core and the serial communications interface are adapted to receive clock signals from an external source.

15. An internally-clocked microprocessing device capable of receiving data from a bursty serial data transmission comprising:
a serial communications transceiver and controller collectively adapted to receive bursty data streams from an external source and provide the data streams to an internal data bus;
a Universal Asynchronous Receiver/Transmitter (UART) connected to the internal data bus and adapted to receive the bursty data streams from the serial communications transceiver; and
a microprocessor core connected to the internal data bus and adapted to receive core-compatible data from the UART and further adapted to utilize a programmable internal clock signal as a core clock;
wherein the UART is adapted to utilize the programmable internal clock signal as a reference clock for recovering a transmission clock signal from the bursty serial data stream and adapted to convert the bursty data stream into a core-compatible format by varying the programmable internal clock signal to correspond to the recovered transmission clock signal.

16. The device of claim 15 wherein the serial communications transceiver and controller comprise a Universal Serial Bus (USB) transceiver and USB controller, respectively.

17. The device of claim 15 further comprising a temperature-compensated programmable internal clock generator adapted to provide the internal clock signal.

18. The device of claim 17 wherein the internal clock generator comprises a mask-programmable resistive-capacitive (RC) circuit network.

19. The device of claim 17 wherein the internal clock generator further comprises a register-programmable capacitor adapted to provide adjustment of a center frequency of the internal clock generator.

20. A method of using a bursty serial data transmission on a single-chip mixed-signal system, comprising the steps of:
receiving a bursty serial data transmission utilizing an integrated serial communications transceiver and controller;
extracting a source clock signal from the data transmission utilizing an internally-generated clock signal of a microprocessor core by varying the frequency of the internally generated clock signal to correspond to the extracted source clock signal;
using the extracted source clock signal to convert the data into a core-usable format; and
transmitting the data to the core via an internal data bus.

21. The method of claim 20 wherein the step of receiving a bursty serial data transmission further comprises receiving a bursty serial data transmission with a Universal Serial Bus (USB) transceiver and a USB controller.

22. The method of claim 20 further comprising the step of generating a core clock signal with an integrated, mask-programmable internal clock generator having a temperature-compensated resistive-capacitive (RC) circuit network adapted to provide the clock signal and having a register-programmable capacitor affecting a center frequency of the core clock signal.

* * * * *